US011851326B2

(12) United States Patent
Taylor et al.

(10) Patent No.: US 11,851,326 B2
(45) Date of Patent: *Dec. 26, 2023

(54) COMPOSITIONS AND AGGREGATES COMPRISING BORON NITRIDE NANOTUBE STRUCTURES, AND METHODS OF MAKING

(71) Applicant: BNNano, Inc., Cary, NC (US)

(72) Inventors: Jason Edward Taylor, Cary, NC (US); Mark Edmond, Raleigh, NC (US); Steven Michael Wilcenski, Cary, NC (US)

(73) Assignee: BNNano, Inc., Cary, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/660,687

(22) Filed: Apr. 26, 2022

(65) Prior Publication Data

US 2022/0242730 A1    Aug. 4, 2022

Related U.S. Application Data

(63) Continuation of application No. 15/928,969, filed on Mar. 22, 2018, now Pat. No. 11,332,369.

(51) Int. Cl.
*C30B 25/14*    (2006.01)
*C01B 21/064*    (2006.01)
(Continued)

(52) U.S. Cl.
CPC .......... *C01B 21/0648* (2013.01); *C30B 25/14* (2013.01); *C30B 25/165* (2013.01);
(Continued)

(58) Field of Classification Search
CPC ..... C30B 25/14; C30B 25/165; C30B 29/403; C30B 29/602; C01B 21/0648;
(Continued)

(56) References Cited

U.S. PATENT DOCUMENTS 7,452,513 B2    11/2008    Matveev
7,973,262 B2    7/2011    Matveev
(Continued)

FOREIGN PATENT DOCUMENTS

WO    2016/100715 A1    6/2016
WO    2017/196559 A1    11/2017

OTHER PUBLICATIONS

Japanese Office Action (with English translation) dated Jun. 3, 2022 (Application No. 2021-500492).

(Continued)

*Primary Examiner* — Robert M Kunemund
(74) *Attorney, Agent, or Firm* — Brown & Brown IP Law PLLC

(57) ABSTRACT

A composition (or an aggregate) comprising a h-BN/BNNT structure that comprises a boron nitride nanotube structure and at least a first hexagonal boron nitride structure. Also, a composition comprising at least a first epitaxial h-BN/BNNT structure and at least one metal adhered to the first epitaxial h-BN/BNNT structure. Also, a composition (or an aggregate) that comprises independent boron nitride nanotubes, in which a total mass percentage of independent hexagonal boron nitride and residual boron in the composition is not more than 35%. Also, a material comprising at least a first hexagonal boron nitride structure and at least a first boron nitride nanotube structure, wherein atoms in the first hexagonal boron nitride structure are epitaxially aligned with atoms in the first boron nitride nanotube structure that are closest to the first hexagonal boron nitride structure.

20 Claims, 13 Drawing Sheets

(51) Int. Cl.
*C30B 25/16* (2006.01)
*C30B 29/40* (2006.01)
*C30B 29/60* (2006.01)
*B82Y 40/00* (2011.01)
*B82Y 30/00* (2011.01)

(52) U.S. Cl.
CPC .......... C30B 29/403 (2013.01); C30B 29/602 (2013.01); *B82Y 30/00* (2013.01); *B82Y 40/00* (2013.01); *C01P 2002/76* (2013.01); *C01P 2004/04* (2013.01); *C01P 2004/13* (2013.01); *C01P 2004/50* (2013.01); *C01P 2004/84* (2013.01)

(58) Field of Classification Search
CPC ..... B82Y 30/00; B82Y 40/00; C01P 2002/76; C01P 2005/04; C01P 2004/13; C01P 2004/50; C01P 2004/84
See application file for complete search history.

(56) References Cited

U.S. PATENT DOCUMENTS

| | | | |
|---|---|---|---|
| 8,252,243 | B2 | 8/2012 | Matveev |
| 9,093,581 | B2 | 7/2015 | Jiang et al. |
| 9,331,198 | B2 | 5/2016 | Kelber |
| 10,083,890 | B2 | 9/2018 | Whitney et al. |
| 10,246,623 | B2 | 4/2019 | Kim |
| 11,332,369 | B2* | 5/2022 | Taylor .................. C30B 25/165 |
| 2007/0196249 | A1 | 8/2007 | Fridman et al. |
| 2008/0056961 | A1 | 3/2008 | Matveev |
| 2008/0245749 | A1 | 10/2008 | Matveev |
| 2009/0050713 | A1 | 2/2009 | Matveev |
| 2011/0250098 | A1 | 10/2011 | Matveev |
| 2015/0023858 | A1 | 1/2015 | Tour |
| 2017/0066700 | A1 | 3/2017 | Hermans |
| 2017/0197832 | A1 | 7/2017 | Fathalizadeh et al. |
| 2017/0352606 | A1 | 12/2017 | Whitney et al. |
| 2019/0097000 | A1 | 3/2019 | Berry et al. |
| 2019/0198418 | A1 | 6/2019 | Whitney et al. |
| 2019/0276310 | A1 | 9/2019 | Liu |

OTHER PUBLICATIONS

Goldberg, Dmitri et al., "*Boron Nitride Nanotubes and Nanosheets*," ACS NANO, 2010, vol. 4, No. 6, pp. 2979-2993.
Song, H.S. et al., "*Coating Aluminum Borate ($Al_{18}B_4hd 33$) Nanowire Webs with BN*," Phys. Chem. C, 2007, vol. 11, No. 3, pp 1136-1139.
Pan and Chen, Nanoscale Research Letters 2014, *Large-scale fabrication of boron nitride nanotubes with high purity via solid-state reaction method*, Nano Express, http://www.nanoscalereslett.com/content/9/1/555, 6 pages.
Fathalizadeh et al., NANO Letters, *Scaled Synthesis of Boron Nitride Nanotubes, Nanoribbons, and Nanococoons Using Direct Feedstock Injection into an Extended-Pressure, Inductively-Coupled Thermal Plasma*, ACS Publications, American Chemical Society, pubs.acs.org/NanoLetter, Jun. 18, 2014, 6 pages.
Leven et al., *Inter-layer Potential for Hexagonal Boron Nitride*, 24 pages.
Oded Hod, *Graphite and Hexagonal Boron-Nitride Possess the Same Interlayer Distance. Why?*, School of Chemistry, The Sackler Faculty of Exact Sciences, Tel Aviv University, 18 pages.
International Search Report and Written Opinion of the International Searching Authority (PCT/US19/23335) dated Sep. 4, 2019, 14 pages.
International Preliminary Report on Patentabiliy (Chapter I) (Application No. PCT/US2019/023335) dated Sep. 22, 2020.

* cited by examiner

Hexagonal
Boron Nitride
Nucleated on
Typical Nanotube

COMPOSITIONS AND AGGREGATES COMPRISING BORON NITRIDE NANOTUBE STRUCTURES, AND METHODS OF MAKING

CROSS-REFERENCE TO RELATED APPLICATIONS

This application is a continuation of U.S. patent application Ser. No. 15/928,969, filed Mar. 22, 2018 now U.S. Pat. No. 11,332,369, the entirety of which is incorporated herein by reference.

FIELD OF THE INVENTIVE SUBJECT MATTER

The present inventive subject matter relates to novel and unforeseen materials that each comprise an arrangement of atoms that includes a first region of the arrangement of atoms corresponding (to at least a specified extent) to an idealized boron nitride nanotube, the arrangement of atoms also including at least a second region (that differs from the first region), such novel and unforeseen materials having unique combinations of properties.

In one aspect of the present inventive subject matter, therefore, the present inventive subject matter provides novel and unforeseen materials that have unique combinations of properties.

The present inventive subject matter also provides novel compositions and aggregates that include such novel and unforeseen materials.

The present inventive subject matter also provides novel compositions and aggregates that comprise boron nitride nanotubes and that have novel characteristics.

The present inventive subject matter also provides novel methods of making the novel and unforeseen materials, compositions and aggregates.

BACKGROUND

Boron nitride nanotubes are nano-scale hollow tubes, typically of diameters in the range of from 2 to 20 nanometers, and typically of lengths in the range of tens of nanometers up to tens of microns. The expression "boron nitride nanotube" (or "boron nitride nanotubes") encompasses structures that consist of a single layer which is generally tubular (i.e., single-wall boron nitride nanotubes) as well as structures that consist of multiple layers which are each generally tubular and coaxial (i.e., multi-wall boron nitride nanotubes).

A hypothetical idealized boron nitride nanotube consists of one or more layers (i.e., walls), each layer consisting of a generally tubular arrangement of boron atoms and nitrogen atoms, the boron atoms and nitrogen atoms arranged in a repeating hexagonal pattern in which boron atoms and nitrogen atoms alternate. As is well known by persons of skill in the art, an idealized boron nitride nanotube can be conceptualized as the structure that would result from taking a layer (or plural layers) of boron and nitrogen atoms, in which boron and nitrogen are arranged alternatingly in a repeating hexagonal pattern, curling the layer (or layers) so that two sides of the layer (or respective layers) meet along a seam and connect, with the seam matching the alternating boron/nitrogen repeating hexagonal pattern, to provide a hollow cylindrical array of one wall (or of a number of walls corresponding to the number of layers) of boron and nitrogen atoms in a continuous alternating hexagonal pattern (i.e., the seam is not discernable).

Boron nitride nanotubes are often compared with carbon nanotubes in terms of their respective chemical structures and their respective properties. It has been noted that while there are similarities (e.g., excellent mechanical strength), there are also many differences, including (among many other differences) that boron nitride nanotubes are electrically insulating (whereas carbon nanotubes are electrically conductive), and that boron nitride nanotubes are stable to much higher temperatures.

The many strikingly favorable properties of boron nitride nanotubes include, inter alia, strength-to-mass ratio (high strength/low density), toughness, stiffness, thermal conductance, flame resistance, corrosion resistance, neutron radiation absorption/protection, friction and wear resistance, oxidation resistance, hydrophobicity, hydrogen storage capacity, nanoparticle carrier effectiveness, and other properties.

There are a number of forms of defective boron nitride nanotubes that are well known to persons of skill in the art, e.g., dixie cup defects and bamboo defects.

BRIEF SUMMARY OF THE INVENTIVE SUBJECT MATTER

As noted above, the present inventive subject matter provides, in one aspect, novel and unforeseen materials (epitaxial h-BN/BNNT structures, as defined herein) that each comprise an arrangement of atoms that includes a first region of the arrangement of atoms corresponding (to at least a specified extent) to an idealized boron nitride nanotube, the arrangement of atoms also including at least a second region (that differs from the first region), such novel and unforeseen materials having unique combinations of properties.

In accordance with a first aspect of the present inventive subject matter, there is provided a composition comprising at least a first epitaxial h-BN/BNNT structure (as defined herein), the first epitaxial h-BN/BNNT structure comprising at least a first boron nitride nanotube structure (as also defined herein) and at least a first hexagonal boron nitride structure (as also defined herein), the first hexagonal boron nitride structure epitaxial with respect to the first boron nitride nanotube structure (as also defined herein).

In accordance with a second aspect of the present inventive subject matter, there is provided an aggregate that comprises a one-piece structure comprising at least a first epitaxial h-BN/BNNT structure (as defined herein), the first epitaxial h-BN/BNNT structure comprising at least a first boron nitride nanotube structure (as also defined herein) and at least a first hexagonal boron nitride structure (as also defined herein), the first hexagonal boron nitride structure epitaxial with respect to the boron nitride nanotube structure (as also defined herein), the one-piece structure having a first dimension of at least 100 nm and a second dimension of at least 100 nm, the second dimension perpendicular to the first dimension.

The present inventive subject matter also provides other novel compositions and aggregates that comprise epitaxial h-BN/BNNT structures as defined herein.

The novel and unforeseen epitaxial h-BN/BNNT structures (as defined herein) provided by the present inventive subject matter exhibit improved properties, e.g., excellent adherence to matrix materials (such as enhanced physical/mechanical resistance to removal from matrix materials), provide excellent nano-nucleation sites for metals to crystallize (e.g., in the case of casting one or more metals, such as aluminum, magnesium, titanium, which have melting points that are lower than the temperature at which boron nitride nanotube structures degrade), and can provide favorable properties even after being subjected to extremely high temperatures.

The present inventive subject matter also provides novel compositions and aggregates that comprise independent boron nitride nanotubes (as defined herein) and that have novel characteristics.

The present inventive subject matter also relates to high-purity compositions and aggregates that comprise boron nitride nanotube structures and/or independent boron nitride nanotubes, e.g., compositions and aggregates that comprise boron nitride nanotube structures and/or independent boron nitride nanotubes and in which the combined amount of residual boron and independent hexagonal boron nitride (as defined herein) is limited to being below (or not greater than) specific mass percentages.

In accordance with a third aspect of the present inventive subject matter, there is provided a composition that comprises a plurality of independent boron nitride nanotubes (as defined herein), in which a sum of [1] a total mass of any independent hexagonal boron nitride (as also defined herein) in the composition and [2] a total mass of any residual boron (as also defined herein) in the composition accounts for not more than 35% of the mass of the composition.

In accordance with a fourth aspect of the present inventive subject matter, there is provided an aggregate that comprises a one-piece structure comprising a plurality of independent boron nitride nanotubes (as defined herein), the one-piece structure having a first dimension of at least 100 nm and a second dimension of at least 100 nm, the second dimension perpendicular to the first dimension, a sum of [1] a total mass of independent hexagonal boron nitride (as also defined herein) in the one-piece structure and [2] a total mass of any residual boron (as also defined herein) in the one-piece structure accounts for not more than 35% of the mass of the one-piece structure.

The present inventive subject matter also relates to high-quality compositions and aggregates that comprise boron nitride nanotube structures and/or independent boron nitride nanotubes, e.g., compositions and aggregates that comprise boron nitride nanotube structures and/or independent boron nitride nanotubes and in which the combined amount of boron nitride nanotube structures and/or independent boron nitride nanotubes with dixie cup defects (defined below) and boron nitride nanotube structures and/or independent boron nitride nanotubes with bamboo defects (defined below) is limited to being below (or not greater than) specific percentages.

In accordance with a fifth aspect of the present inventive subject matter, there is provided a composition that comprises at least ten independent boron nitride nanotubes (as defined herein) that have a length of at least 50 nm, in which:
among a sum of [1] the independent boron nitride nanotubes in the composition that have a length of at least 50 nm, and [2] boron nitride nanotube structures (as also defined herein) in the composition that have a length of at least 50 nm, not more than 1% of said sum have at least one defect selected from among dixie cup defects (as also defined herein) and bamboo defects (as also defined herein).

In accordance with a sixth aspect of the present inventive subject matter, there is provided an aggregate that comprises a one-piece structure comprising a plurality of independent boron nitride nanotubes (as defined herein), the one-piece structure having a first dimension of at least 100 nm and a second dimension of at least 100 nm, the second dimension perpendicular to the first dimension, in which:
among a sum of [1] the independent boron nitride nanotubes in the one-piece structure that have a length of at least 50 nm, and [2] boron nitride nanotube structures (as also defined herein) in the one-piece structure that have a length of at least 50 nm, not more than 1% of said sum have at least one defect selected from among dixie cup defects (as also defined herein) and bamboo defects (as also defined herein).

The present inventive subject matter also relates to compositions and aggregates that comprise boron nitride nanotube structures and/or independent boron nitride nanotubes in which the quantity of single-wall boron nitride nanotube structures and/or independent boron nitride nanotubes, in relation to the quantity of multi-wall boron nitride nanotube structures and/or independent boron nitride nanotubes, is above (or at least) specific percentages.

In accordance with a seventh aspect of the present inventive subject matter, there is provided a composition that comprises at least ten independent boron nitride nanotubes (as defined herein), in which:
among a sum of [1] the independent boron nitride nanotubes in the composition that have a length of at least 50 nm, and [2] boron nitride nanotube structures (as also defined herein) in the composition that have a length of at least 50 nm, each of at least 50% of said sum is single-wall (as also defined herein).

In accordance with an eighth aspect of the present inventive subject matter, there is provided an aggregate that comprises a one-piece structure comprising at least one independent boron nitride nanotube (as defined herein), the one-piece structure having a first dimension of at least 100 nm and a second dimension of at least 100 nm, the second dimension perpendicular to the first dimension, in which:
among a sum of [1] the independent boron nitride nanotubes in the one-piece structure that have a length of at least 50 nm, and [2] boron nitride nanotube structures (as also defined herein) in the one-piece structure that have a length of at least 50 nm, each of at least 50% of said sum is single-wall (as also defined herein).

The present inventive subject matter also provides novel methods of making the novel and unforeseen materials, compositions and aggregates.

In accordance with a ninth aspect of the present inventive subject matter, there is provided a method of making a composition, comprising:
supplying to a first region of a chamber a mixture of nitrogen gas and hydrogen gas;
converting at least a portion of the mixture of nitrogen gas and hydrogen gas to plasma;
supplying to a second region of the chamber a mixture of at least one boron-containing material and nitrogen gas, whereby the mixture of at least one boron-containing material and nitrogen gas contacts the plasma to form a reaction mixture;
converting at least a portion of the mixture to epitaxial h-BN/BNNT structures.

The inventive subject matter may be more fully understood with reference to the accompanying drawings and the following detailed description of the inventive subject matter.

BRIEF DESCRIPTION OF THE DRAWING FIGURES

FIG. 1 schematically depicts a representative embodiment of an apparatus 10 that can be used to make epitaxial h-BN/BNNT structures, as well as compositions and/or aggregates that comprise epitaxial h-BN/BNNT structures, in accordance with the first and second aspects of the present inventive subject matter.

DETAILED DESCRIPTION OF THE INVENTIVE SUBJECT MATTER

Figure 1:
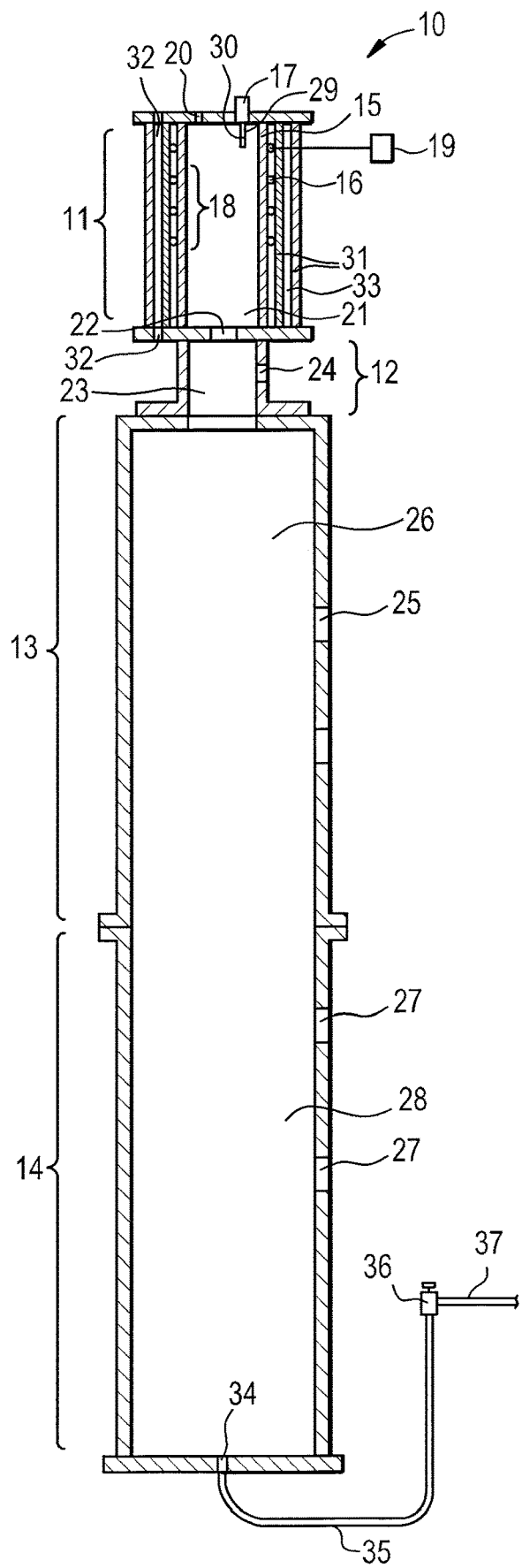

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Although the terms "first", "second", etc. are used herein in referring to various structures, epitaxial h-BN/BNNT structures, boron nitride nanotube structures, hexagonal boron nitride structures, members, percentages, ranges of percentages, dimensions, regions, and connection sections, such structures, epitaxial h-BN/BNNT structures, boron nitride nanotube structures, hexagonal boron nitride structures, members, percentages, ranges of percentages, dimensions, regions, connection sections are not limited by these numerical terms. These numerical terms are used only to identify individually each structure, epitaxial h-BN/BNNT structure, boron nitride nanotube structure, hexagonal boron nitride structure, member, percentage, range of percentages, dimension, region, or connection section, and/or to distinguish one structure, epitaxial h-BN/BNNT structure, boron nitride nanotube structure, hexagonal boron nitride structure, member, percentage, range of percentages, dimension, region, or connection section from another.

The expression "each" is used in many places in the present specification, in connection with a feature (or features) in pluralities of items (or in "at least one" item or the like) in order to indicate that the feature (or features) is/are present in each of the specified items (or individual item), as opposed to a feature that is somehow provided by a plurality of items and not necessarily by an individual item, or as opposed to a feature that is an average of the feature with respect to a plurality of items. Such uses of the expression "each" take a variety of forms, e.g.:

"materials that each comprise an arrangement of atoms . . . ,"

"multiple layers which are each generally tubular and coaxial,"

"one or more layers (i.e., walls), each layer consisting of a generally tubular arrangement of boron atoms and nitrogen atoms,"

"each of at least 50% of said sum is single-wall,"

"each of the at least one hexagonal boron nitride structure (s) is/are epitaxial with respect to the boron nitride nanotube structure,"

"each epitaxial h-BN/BNNT structure includes a boron nitride nanotube structure and at least one hexagonal boron nitride structure,"

"hexagonal boron nitride structures that are each epitaxial with respect to the boron nitride nanotube structure,"

"a structure that comprises (or a plurality of structures that each comprise),"

"for each of at least 10% of the atoms in the outermost wall of the boron nitride nanotube structure, there is an atom that [1] is in a hexagonal boron nitride structure that is epitaxial with respect to the boron nitride nanotube structure, and that [2] is within 10 nanometers of such atom,"

"each of a quantity of boron nitride nanotube structures that is at least 10% of the sum of [1] the quantity of independent boron nitride nanotubes in the composition that have a length of at least 50 nm, and [2] the quantity of boron nitride nanotube structures in the composition that have a length of at least 50 nm: the boron nitride nanotube structure has a length of at least 50 nm, and a total of at least 10% of the outermost wall of the boron nitride nanotube structure is covered by hexagonal boron nitride structures that are each epitaxial with respect to the boron nitride nanotube structure," and "each of at least some of said sum . . . "

As noted above, in accordance with a first aspect of the present inventive subject matter, there is provided a composition comprising at least a first epitaxial h-BN/BNNT structure, the first epitaxial h-BN/BNNT structure comprising at least a first boron nitride nanotube structure and at least a first hexagonal boron nitride structure, the first hexagonal boron nitride structure epitaxial with respect to the first boron nitride nanotube structure.

The expression "epitaxial h-BN/BNNT structure," as used herein, refers to a novel and unforeseen structure provided by the present inventive subject matter, namely, a structure that comprises a boron nitride nanotube structure (defined below) and at least one hexagonal boron nitride structure (defined below), in which each of the at least one hexagonal boron nitride structure(s) is/are epitaxial with respect to the boron nitride nanotube structure. Accordingly, each epitaxial h-BN/BNNT structure includes a boron nitride nanotube structure and at least one hexagonal boron nitride structure.

As is well known by persons of skill in the art, the expression "epitaxial" is used extensively in relation to crystal nucleation and crystal growth.

A crystal is defined as atoms, molecules or ions arranged in an orderly repeating pattern—a crystal lattice—extending in all three spatial dimensions. Crystal growth is the process where a pre-existing crystal becomes larger as more atoms, molecules or ions are added in their ordered positions in the crystal lattice. During crystal growth, the atoms, molecules or ions must fall into the correct lattice positions in order for a well-ordered crystal to grow. When atoms, molecules or ions fall into positions different from those in the idealized crystal lattice, defects are formed. Typically, the atoms, molecules or ions in a crystal lattice are held in place, i.e., they cannot readily move from their positions, and so crystal growth is often irreversible in that once the molecules or ions have fallen into place in the growing lattice, they are fixed.

Crystallization is typically understood as consisting of two processes, namely, crystal nucleation and crystal growth. Crystal nucleation is where a new crystal is formed (i.e., there is no pre-existing crystal; crystal growth is where a atoms, molecules or ions are added to an existing crystal, i.e., a crystal that has been nucleated (and optionally grown, i.e., adding to a crystal that has been nucleated is referred to as crystal growth; adding to a crystal that has been nucleated and already grown to some degree is also referred to a crystal growth).

Epitaxy refers to nucleating a crystal of a particular orientation on another crystal, where the orientation is determined by the underlying crystal. A statement herein that a first structure (i.e., a hexagonal boron nitride structure) is epitaxial with respect to a second structure (i.e., a boron nitride nanotube structure), means that [1] the atoms in the second structure, and [2] the atoms in the first structure that are closest to the second structure, are arranged relative to each other in the manner that atoms in an idealized structure corresponding to the second structure are arranged relative to each other, i.e., they are arranged in the manner that results from (or would result from) nucleating the second structure on the first structure and growing the second structure on the nucleated second structure.

Accordingly, the expression "hexagonal boron nitride structure that is epitaxial with respect to the boron nitride nanotube structure" (and analogous expressions, e.g., "hexagonal boron nitride structures that are each epitaxial with respect to the boron nitride nanotube structure," "each of the at least one hexagonal boron nitride structure(s) is/are epitaxial with respect to the boron nitride nanotube structure," "hexagonal boron nitride that is epitaxial with respect to the boron nitride nanotube structure," etc.), as used herein, means that for each such hexagonal boron nitride structure, [1] the atoms in the hexagonal boron nitride structure, and [2] the atoms in the boron nitride nanotube structure that are closest to the hexagonal boron nitride structure, are arranged relative to each other in the manner that atoms in an idealized hexagonal boron nitride structure (discussed below) are arranged relative to each other, i.e., they are arranged in the manner that results from (or would result from) nucleating a hexagonal boron nitride structure on a boron nitride nanotube structure and growing the hexagonal boron nitride structure on the nucleated hexagonal boron nitride structure.

Hexagonal boron nitride is characterized by stacking of two-dimensional honeycomb lattices made of boron and nitrogen atoms that are strongly bound by highly polar B—N bonds. The layers of hexagonal boron nitride generally stack in an AA' stacking mode, i.e., a boron atom bearing a partial positive charge in one layer resides on the oppositely charged nitrogen atoms on the adjacent layers.

The expression "boron nirtide nanotube structure" is used herein to refer to a portion of an epitaxial h-BN/BNNT structure in which boron atoms and nitrogen atoms are in an arrangement of atoms that has a ten percent or lower defect ratio relative to an idealized boron nitride nanotube (discussed above) of the same length, diameter and number of walls.

The expression "defect ratio," as used herein, refers to the percentage of atoms in a structure that are misplaced relative to an idealized structure, i.e., the expression "arrangement of atoms that has a ten percent or lower defect ratio relative to an idealized boron nitride nanotube," as used herein, encompasses structures in which the proportion of deviations from an idealized boron nitride nanotube (of the same length, diameter, and number of walls) is not more than 10 percent, such deviations being quantified in terms of the number of atoms in the actual boron nitride nanotube structure that are in positions that do not correspond to their respective positions in the idealized boron nitride nanotube, divided by the total number of positions for atoms in the idealized boron nitride nanotube (or by subtracting, from 100 percent, the percentage of atoms in the actual boron nitride nanotube structure that are in positions that correspond to their respective positions in the idealized boron nitride nanotube vs. the total number of positions in the idealized boron nitride nanotube). A single deviation is where a single atom in the idealized boron nitride nanotube is replaced by a different atom, or where a single shift occurs. For example, in comparing the arrangement of atoms in an actual boron nitride nanotube structure with the arrangement of atoms in an idealized boron nitride nanotube, a single set of deviations can encompass a sequence of atoms (one atom wide) extending around the actual boron nitride nanotube structure, with the atoms on the respective opposite sides of the sequence of atoms (and not including the sequence of atoms) being compared to the arrangement of atoms in the idealized boron nitride nanotube.

As noted above, a hypothetical idealized boron nitride nanotube consists of one or more layers (i.e., walls), each layer consisting of a generally tubular arrangement of boron atoms and nitrogen atoms, the boron atoms and nitrogen atoms arranged in a repeating hexagonal pattern in which boron atoms and nitrogen atoms alternate.

The expression "hexagonal boron nitride structure," as used herein, refers to a portion of an epitaxial h-BN/BNNT structure in which atoms of boron and nitrogen are in an arrangement of atoms that has a ten percent or lower defect ratio relative to an idealized hexagonal boron nitride structure (discussed below) of the same shape and number of layers.

As above, the expression "defect ratio," as used herein, refers to the percentage of atoms in a structure that are misplaced relative to an idealized structure. In this context, i.e., in the expression "ten percent or lower defect ratio relative to an idealized hexagonal boron nitride structure (discussed below) of the same shape and number of layers," a defect ratio of ten percent or lower encompasses structures in which the proportion of deviations from an idealized hexagonal boron nitride structure, of the same shape and number of layers, is not more than 10 percent, such deviations being quantified in terms of the number of atoms in the actual arrangement of atoms that are in positions that do not correspond to their respective positions in the idealized hexagonal boron nitride structure, divided by the total number of positions for atoms in the idealized hexagonal boron nitride structure, and expressed as a percentage (or by subtracting, from 100 percent, the percentage of atoms in the actual arrangement of atoms that are in positions that correspond to their respective positions in the idealized hexagonal boron nitride structure vs. the total number of positions in the idealized hexagonal boron nitride structure). A single deviation is where a single atom in the idealized hexagonal boron nitride structure is replaced by a different atom, or where a single shift occurs. For example, in comparing the arrangement of atoms in an actual material with the arrangement of atoms in an idealized hexagonal boron nitride structure, a single set of deviations encompasses a sequence of atoms (one atom wide) extending across the actual material, with the atoms on the respective opposite sides of the sequence of atoms (and not including the sequence of atoms) being compared to the arrangement of atoms in the idealized hexagonal boron nitride structure.

The expression "idealized hexagonal boron nitride structure," as used herein, refers to a hypothetical ideal boron nitride structure that consists of one or more layers, each layer consisting of an arrangement of boron atoms and nitrogen atoms that corresponds to defect-free hexagonal boron nitride crystal. As is well known to persons of skill in the art, the boron atoms and nitrogen atoms in hexagonal boron nitride crystal are arranged in a repeating hexagonal pattern in which boron atoms and nitrogen atoms alternate.

The expression "hexagonal boron nitride region," as used herein, refers to a region (e.g., a region of a one-piece unitary structure) of a hexagonal boron nitride structure.

The expression "hexagonal boron nitride" is used herein to refer to one or more hexagonal boron nitride structures.

The expression "boron and nitrogen atoms nucleated on a boron nitride nanotube structure," as used herein, refers to, from among all of the boron and nitrogen atoms in hexagonal boron nitride structures that are each epitaxial with respect to the boron nitride nanotube structure, only those boron and nitrogen atoms that abut atoms in the boron nitride nanotube structure, i.e., only those boron and nitrogen atoms that are arranged in the manner that results from (or would result from) nucleating hexagonal boron nitride on a boron nitride nanotube structure. For example, if hexagonal boron nitride is nucleated and grown on a boron nitride nanotube structure, the expression "boron and nitrogen atoms nucleated on a boron nitride nanotube structure" refers to only the boron and nitrogen atoms that are nucleated on the boron nitride nanotube structure, and not the boron and nitrogen atoms that are subsequently grown on the nucleated boron and nitrogen atoms.

Thus, the expression "hexagonal boron nitride that is epitaxial with respect to the boron nitride nanotube structure" (defined above) differs from the expression "boron and nitrogen atoms nucleated on a boron nitride nanotube structure" in that the expression "hexagonal boron nitride that is epitaxial with respect to the boron nitride nanotube structure" refers to all of the atoms in all of the hexagonal boron nitride structures that are epitaxial with respect to the boron nitride nanotube structure (not just the boron and nitrogen atoms nucleated on the boron nitride nanotube).

The expression "independent boron nitride nanotube" is used herein to refer to a structure that comprises boron atoms and nitrogen atoms in an arrangement of atoms [1] that has a ten percent or lower defect ratio relative to an idealized boron nitride nanotube (as discussed above) of the same length, diameter and number of walls, and [2] with respect to which there is no hexagonal boron nitride structure that is epitaxial (i.e., there is no hexagonal boron nitride that is epitaxial with respect to the nitrogen and boron atoms in the arrangement of atoms that has a ten percent or lower defect ratio relative to an idealized boron nitride nanotube).

The expression "independent hexagonal boron nitride" is used herein to refer to a structure that comprises (or a plurality of structures that each comprise) boron atoms and nitrogen atoms in an arrangement of atoms [1] that has a ten percent or lower defect ratio relative to an idealized hexagonal boron nitride structure (as discussed above) of the same shape and number of layers, and [2] with respect to which there is no boron nitride nanotube structure that is epitaxial (i.e., there is no boron nitride nanotube with respect to which the arrangement of atoms that has a ten percent or lower defect ratio relative to an idealized hexagonal boron nitride structure is epitaxial).

As discussed below, one of the characteristics of epitaxial h-BN/BNNT structures disclosed herein is that hexagonal boron nitride structures (that are epitaxial with respect to boron nitride nanotube structures) is readily perceived (e.g., by normal human vision) to "cover" boron nitride nanotube structures (partially or completely). The present specification includes definitions by which, for any particular boron nitride nanotube structure, the extent to which the boron nitride nanotube structure is covered by hexagonal boron nitride structures can be quantified as a percentage. In order for such quantifications to be definite (i.e., extremely precise), such that a person of skill in the art can readily determine whether any particular structure satisfies an expression herein relating to such coverage, and/or to determine whether any particular composition or aggregate satisfies an expression relating to at least a specific percentage of boron nitride nanotube structures each being covered at least a specific percentage, the present specification includes (below) very detailed definitions to make such calculations sufficiently precise.

The expression "a total of at least 10% of the outermost wall of the boron nitride nanotube structure is covered by hexagonal boron nitride structures that are each epitaxial with respect to the boron nitride nanotube structure," as used herein, means that for each of at least 10% of the atoms in the outermost wall of the boron nitride nanotube structure, there is an atom that [1] is in a hexagonal boron nitride structure that is epitaxial with respect to the boron nitride nanotube structure, and that [2] is within 10 nanometers of such atom.

The expression "outermost wall," as used herein in relation to a boron nitride nanotube structure, refers to the outermost wall of a multi-wall boron nitride nanotube structure (i.e., the wall that is farthest from the axis of the boron nitride nanotube structure, and farthest from the space within the tube) or (in the case of a single-wall boron nitride nanotube structure), the single wall.

The expression "outermost wall," as used herein in relation to an independent boron nitride nanotube, refers to the outermost wall of an independent multi-wall boron nitride nanotube (i.e., the wall that is farthest from the axis of the independent boron nitride nanotube, and farthest from the space within the tube) or (in the case of an independent single-wall boron nitride nanotube), the single wall.

In addition to the above definitions relating to the calculation of percentages to which boron nitride nanotube structures are covered by hexagonal boron nitride structures in epitaxial h-BN/BNNT structures, there are also epitaxial h-BN/BNNT structures in which a plurality of boron nitride nanotube structures might be clumped together, and the entire clump (which includes multiple boron nitride nanotube structures) might be covered (at least to a percentage) by hexagonal boron nitride structures that are epitaxial to boron nitride nanotube structures (e.g., outermost ones) in the clump. In order for such quantifications to be sufficiently precise that a person of skill in the art can readily determine whether any particular structure satisfies an expression herein relating to such coverage, and/or to determine whether any particular composition or aggregate satisfies an expression relating to such coverage, the present specification includes additional definitions (starting with a definition of "clump" and specific types of clumps) to make such calculations sufficiently precise.

The expression "clump," as used herein (e.g., in the expressions "independent boron nitride nanotube clump," "boron nitride nanotube structure clump," and "boron nitride nanotube structure/independent boron nitride nanotube clump") means a group of at least two independent boron nitride nanotubes that are all in contact with one another, at least two boron nitride nanotube structures that are all in contact with one another, or at least one independent boron nitride nanotube and at least one boron nitride nanotube structure that are all in contact with one another. A single "clump" refers to such a group in which each member of the group is in direct contact or indirect contact with every other member of the group (indirect contact between respective members of the group meaning that while the members are not in direct contact with each other, a series of direct-contact pairs of members that extends between the member, i.e., first and second members are in direct contact with each other, a third member is in direct contact with at least one of the first and second members, a fourth member is in direct contact with at least one of the first through third members, a fifth member is in direct contact with at least one of the first through fourth members, etc.). A representative example where a "clump" is important in the context of the present inventive subject matter is discussed after the definition of "exterior atoms . . . ," below.

The expression "independent boron nitride nanotube clump," as used herein, refers to a clump that comprises plural independent boron nitride nanotubes and no boron nitride nanotube structures.

The expression "boron nitride nanotube structure clump," as used herein, refers to a clump that comprises plural boron nitride nanotube structures and no independent boron nitride nanotubes.

The expression "boron nitride nanotube structure/independent boron nitride nanotube clump," as used herein, refers to a clump that comprises at least one boron nitride nanotube structure and at least one independent boron nitride nanotube. Analogous expressions refer to analogous structures, e.g., analogously, a clump of any specified number (or range) of boron nitride nanotube structures and/or independent boron nitride nanotubes refers to a structure in which the sum of [1] the total number of boron nitride nanotube structures and [2] the total number of independent boron nitride nanotubes equals such specified number (or is within the specified range).

The expression "a total of at least 10% of the exterior atoms of [2] the boron nitride nanotube structure clump, [3] the boron nitride nanotube structure/independent boron nitride nanotube clump, or [5] the boron nitride nanotube structure that is not in a clump,
is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump,"
as used herein, means that for each of at least 10% of the exterior atoms (defined below) of [2] the boron nitride nanotube structure clump, [3] the boron nitride nanotube structure/independent boron nitride nanotube clump, or [5] the boron nitride nanotube structure that is not in a clump, there is an atom [a] that is in a hexagonal boron nitride structure that is epitaxial with respect to a boron nitride nanotube in the clump, and [b] that is within 10 nanometers of such exterior atom.

The expression "exterior atoms of [2] the boron nitride nanotube structure clump, [3] the boron nitride nanotube structure/independent boron nitride nanotube clump, or [5] the boron nitride nanotube structure that is not in a clump," as used herein, encompasses any atom on [2] the boron nitride nanotube structure clump, [3] the boron nitride nanotube structure/independent boron nitride nanotube clump, or [5] the boron nitride nanotube structure that is not in a clump, for which there exists a cylindrical region having a radius of 0.1 angstroms abutting the atom and extending away from the atom for at least 1 mm without intersecting with any other atom on the [2] the boron nitride nanotube structure clump, [3] the boron nitride nanotube structure/independent boron nitride nanotube clump, or [5] the boron nitride nanotube structure that is not in a clump.

A representative example where a "clump" is important in the context of the present inventive subject matter is where one or more boron nitride nanotube structures and/or one or more independent boron nitride nanotubes in a clump are substantially completely covered by other boron nitride nanotube structures and/or independent boron nitride nanotubes (e.g., such substantially completely covered boron nitride nanotube structures and/or one or more independent boron nitride nanotubes are in the middle of a large clump). In such a situation, the atoms of such substantially completely boron nitride nanotube structures and/or one or more independent boron nitride nanotubes would, in accordance with the description herein, not satisfy the definition above of an "exterior atom," and so such atoms would not be considered in determining whether the expression "a total of at least 10% of the exterior atoms of [2] the boron nitride nanotube structure clump, [3] the boron nitride nanotube structure/independent boron nitride nanotube clump, or [5] the boron nitride nanotube structure that is not in a clump,
is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump"
is satisfied.

The expression "residual boron," as used herein, refers to clumps consisting of (or mostly consisting of) boron and/or boron compounds.

The expression "aggregate", as used herein, refers to a one-piece unitary structure, i.e., an integral structure, i.e., a structure that could be lifted by grasping any portion of the structure and lifting (i.e., such portion could be grasped and lifted without gravity causing any portion of the structure to fall apart from any other portion of the structure).

The expression "one-piece unitary structure", as used herein, refers to a structure that is a single piece.

The expression "plurality," as used herein, means two or more (e.g., the expression "plurality of hexagonal boron nitride structures" means two or more hexagonal boron nitride structures).

The expression "not more than" a specified quantity, as used herein, means the specified quantity or fewer (e.g., the expression "not more than 35% of the mass of the composition" means 35% or less of the mass of the composition.

The expression "at least" a specified quantity, as use herein, means the specified quantity or more (e.g., the expression "at least ten boron nitride nanotube structures" means ten boron nitride nanotube structures or more), and vice-versa (e.g., the expression "two or more boron nitride nanotube structures" means at least two boron nitride nanotube structures).

The expression "[a composition or aggregate] comprises at least [a specified percent] of [a type of material]" (e.g., "the composition comprises at least 10% by mass of hexagonal boron nitride") means that the specified type of material accounts for the specified percentage (or range of percentages) among the entire composition or aggregate, and vice-versa (i.e., the expression "[a specified material] accounts for [a specified percent] of [a composition or aggregate] means that the specified percentage (or range of percentages) of the composition or aggregate is the specified material.

In expressions in which "a sum" is characterized as a sum of the respective values for two or more items, e.g., in the expressions:

"a sum of [1] a total mass of any independent hexagonal boron nitride in the composition and [2] a total mass of any residual boron in the composition,"

"a sum of [1] the independent boron nitride nanotubes in the composition that have a length of at least 50 nm, and [2] boron nitride nanotube structures in the composition that have a length of at least 50 nm,"

"a sum of respective quantities of [1] independent boron nitride nanotube clumps in the composition that have a length of at least 50 nm, [2] boron nitride nanotube structure clumps in the composition that have a length of at least 50 nm, [3] boron nitride nanotube structure/independent boron nitride nanotube clumps in the composition that have a length of at least 50 nm, [4] independent boron nitride nanotubes in the composition that are not in a clump and that have a length of at least 50 nm, and [5] boron nitride nanotube structures in the composition that are not in a clump and that have a length of at least 50 nm,"

and similar expressions in which "composition" is replaced by and/or included with "one-piece structure," it is possible that one or more of the values is zero, i.e., the inclusion of an item does not mean that the value for such item is necessarily non-zero.

The expressions "plasma" and "ionized gas" are used herein in accordance with their well known meaning to refer to matter that results when sufficient energy is provided to a gas to free electrons from atoms or molecules and to thus allow ions and electrons to coexist (also referred to as the fourth state of matter, i.e., solid, liquid, gas, plasma).

As noted above, in accordance with a first aspect of the present inventive subject matter, there is provided a composition comprising:

at least a first epitaxial h-BN/BNNT structure,
the first epitaxial h-BN/BNNT structure comprising at least a first boron nitride nanotube structure and at least a first hexagonal boron nitride structure,
the first hexagonal boron nitride structure epitaxial with respect to the first boron nitride nanotube structure.

In some embodiments according to the first aspect of the present inventive subject matter, which can include or not include, as suitable, any of the other features described herein:

a sum of [1] a quantity of independent boron nitride nanotubes in the composition that have a length of at least 50 nm, and [2] a quantity of boron nitride nanotube structures in the composition that have a length of at least 50 nm, is at least ten, and for each of a quantity of boron nitride nanotube structures that is at least 10% of the sum of [1] the quantity of independent boron nitride nanotubes in the composition that have a length of at least 50 nm, and [2] the quantity of boron nitride nanotube structures in the composition that have a length of at least 50 nm:
the boron nitride nanotube structure has a length of at least 50 nm, and a total of at least 10% of the outermost wall of the boron nitride nanotube structure is covered by hexagonal boron nitride structures that are each epitaxial with respect to the boron nitride nanotube structure, and in some of such embodiments:
for each of a quantity of boron nitride nanotube structures that is at least a first percentage (selected from among 20%, 30%, 40%, 50%, 60%, 70%, 80%, and 90%), or that is within a first range of percentages (selected from among 10%-20%, 20%-30%, 30%-40%, 40%-50%, 50%-60%, 60%-70%, 70%-80%, and 80%-90%) of the sum of [1] the quantity of independent boron nitride nanotubes in the composition that have a length of at least 50 nm, and [2] the quantity of boron nitride nanotube structures in the composition that have a length of at least 50 nm:
the boron nitride nanotube structure has a length of at least 50 nm, and a total of at least a second percentage (selected from among 10%, 20%, 30%, 40%, 50%, 60%, 70%, 80%, and 90%), or a total that is within a second range of percentages (selected from among 10%-20%, 20%-30%, 30%-40%, 40%-50%, 50%-60%, 60%-70%, 70%-80%, and 80%-90%) of the outermost wall of the boron nitride nanotube structure is covered by hexagonal boron nitride structures that are each epitaxial with respect to the boron nitride nanotube structure, including any combination of the first percentages (or first range of percentages) and the second percentages (or second range of percentages).

In some embodiments according to the first aspect of the present inventive subject matter, which can include or not include, as suitable, any of the other features described herein:

a sum of respective quantities of [1] independent boron nitride nanotube clumps in the composition that have a length of at least 50 nm, [2] boron nitride nanotube structure clumps in the composition that have a length of at least 50 nm, [3] boron nitride nanotube structure/independent boron nitride nanotube clumps in the composition that have a length of at least 50 nm, [4] independent boron nitride nanotubes in the composition that are not in a clump and that have a length of at least 50 nm, and [5] boron nitride nanotube structures in the composition that are not in a clump and that have a length of at least 50 nm, is at least ten, for each of a quantity that is at least 30% of said sum, among [2] the boron nitride nanotube structure clumps in the composition that have a length of at least 50 nm, [3] the boron nitride nanotube structure/independent boron nitride nanotube clumps in the composition that have a length of at least 50 nm, and [5] the boron nitride nanotube structures in the composition that are not in a clump and that have a length of at least 50 nm:

a total of at least 10% of exterior atoms of [2] the boron nitride nanotube structure clump, [3] the boron nitride nanotube structure/independent boron nitride nanotube clump, or [5] the boron nitride nanotube structure that is not in a clump, is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump, and in some of such embodiments:

a sum of respective quantities of [1] independent boron nitride nanotube clumps in the composition that have a length of at least 50 nm, [2] boron nitride nanotube structure clumps in the composition that have a length of at least 50 nm, [3] boron nitride nanotube structure/independent boron nitride nanotube clumps in the composition that have a length of at least 50 nm, [4] independent boron nitride nanotubes in the composition that are not in a clump and that have a length of at least 50 nm, and [5] boron nitride nanotube structures in the composition that are not in a clump and that have a length of at least 50 nm, is at least ten, for each of a quantity that is at least a first percentage (selected from among 40%, 50%, 60%, 70%, 80%, and 90%), or that is within a first range of percentages (selected from among 30%-40%, 40%-50%, 50%-60%, 60%-70%, 70%-80%, and 80%-90%) of said sum, among [2] the boron nitride nanotube structure clumps in the composition that have a length of at least 50 nm, [3] the boron nitride nanotube structure/independent boron nitride nanotube clumps in the composition that have a length of at least 50 nm, and [5] the boron nitride nanotube structures in the composition that are not in a clump and that have a length of at least 50 nm:

a total of at least a second percentage (selected from among 10%, 20%, 30%, 40%, 50%, 60%, 70%, 80%, and 90%), or a total that is within a second range of percentages (selected from among 10%-20%, 20%-30%, 30%-40%, 40%-50%, 50%-60%, 60%-70%, 70%-80%, and 80%-90%) of exterior atoms of [2] the boron nitride nanotube structure clump, [3] the boron nitride nanotube structure/independent boron nitride nanotube clump, or [5] the boron nitride nanotube structure that is not in a clump, is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump, including any combination of the first percentages (or first range of percentages) and the second percentages (or second range of percentages).

As noted above, in accordance with a second aspect of the present inventive subject matter, there is provided an aggregate comprising:

a one-piece structure comprising at least a first epitaxial h-BN/BNNT structure, the first epitaxial h-BN/BNNT structure comprising at least a first boron nitride nanotube structure and at least a first hexagonal boron nitride structure, the first hexagonal boron nitride structure epitaxial with respect to the boron nitride nanotube structure, the one-piece structure having a first dimension of at least 100 nm and a second dimension of at least 100 nm, the second dimension perpendicular to the first dimension.

In some embodiments according to the second aspect of the present inventive subject matter, which can include or not include, as suitable, any of the other features described herein:

for each of a quantity of boron nitride nanotube structures in the one-piece structure that is at least 10% of the sum of [1] the quantity of independent boron nitride nanotubes in the one-piece structure that have a length of at least 50 nm, and [2] the quantity of boron nitride nanotube structures in the one-piece structure that have a length of at least 50 nm:

a total of at least 10% of the outermost wall of the boron nitride nanotube structure is covered by hexagonal boron nitride structures that are each epitaxial with respect to the boron nitride nanotube structure, and in some of such embodiments:

for each of a quantity of boron nitride nanotube structures in the one-piece structure that is at least a first percentage (selected from among 20%, 30%, 40%, 50%, 60%, 70%, 80%, and 90%), or that is within a first range of percentages (selected from among 10%-20%, 20%-30%, 30%-40%, 40%-50%, 50%-60%, 60%-70%, 70%-80%, and 80%-90%) of the sum of [1] the quantity of independent boron nitride nanotubes in the one-piece structure that have a length of at least 50 nm, and [2] the quantity of boron nitride nanotube structures in the one-piece structure that have a length of at least 50 nm:

a total of at least a second percentage (selected from among 20%, 30%, 40%, 50%, 60%, 70%, 80%, and 90%), or a total that is within a second range of percentages (selected from among 10%-20%, 20%-30%, 30%-40%, 40%-50%, 50%-60%, 60%-70%, 70%-80%, and 80%-90%) of the outermost wall of the boron nitride nanotube structure is covered by hexagonal boron nitride structures that are each epitaxial with respect to the boron nitride nanotube structure, including any combination of the first percentages (or first range of percentages) and the second percentages (or second range of percentages).

In some embodiments according to the second aspect of the present inventive subject matter, which can include or not include, as suitable, any of the other features described herein:

for each of a quantity among [2] boron nitride nanotube structure clumps in the one-piece structure that have a length of at least 50 nm, [3] boron nitride nanotube structure/independent boron nitride nanotube clumps in the one-piece structure that have a length of at least 50 nm, and [5] boron nitride nanotube structures in the one-piece structure that are not in a clump and that have a length of at least 50 nm, that is at least 10% of a sum of respective quantities of [1] independent boron nitride nanotube clumps in the one-piece structure that have a length of at least 50 nm, [2] boron nitride nanotube structure clumps in the one-piece structure that have a length of at least 50 nm, [3] boron nitride nanotube structure/independent boron nitride nanotube clumps in the one-piece structure that have a length of at least 50 nm, [4] independent boron nitride nanotubes in the one-piece structure that are not in a clump and that have a length of at least 50 nm, and [5] boron nitride nanotube structures in the one-piece structure that are not in a clump and that have a length of at least 50 nm:

a total of at least 10% of exterior atoms of [2] the boron nitride nanotube structure clump, [3] the boron nitride nanotube structure/independent boron nitride nanotube clump, or [5] the boron nitride nanotube structure that is not in a clump, is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump, and in some of such embodiments:

for each of a quantity among [2] boron nitride nanotube structure clumps in the one-piece structure that have a length of at least 50 nm, [3] boron nitride nanotube structure/independent boron nitride nanotube clumps in the one-piece structure that have a length of at least 50 nm, and [5] boron nitride nanotube structures in the one-piece structure that are not in a clump and that have a length of at least 50 nm, that is at least a first percentage (selected from among 20%, 30%, 40%, 50%, 60%, 70%, 80%, and 90%), or that is within a first range of percentages (selected from among 10%-20%, 20%-30%, 30%-40%, 40%-50%, 50%-60%, 60%-70%, 70%-80%, and 80%-90%) of a sum of respective quantities of [1] independent boron nitride nanotube clumps in the one-piece structure that have a length of at least 50 nm, [2] boron nitride nanotube structure clumps in the one-piece structure that have a length of at least 50 nm, [3] boron nitride nanotube structure/independent boron nitride nanotube clumps in the one-piece structure that have a length of at least 50 nm, [4] independent boron nitride nanotubes in the one-piece structure that are not in a clump and that have a length of at least 50 nm, and [5] boron nitride nanotube structures in the one-piece structure that are not in a clump and that have a length of at least 50 nm:

a total of at least a second percentage (selected from among 20%, 30%, 40%, 50%, 60%, 70%, 80%, and 90%), or a total that is within a second range of percentages (selected from among 10%-20%, 20%-30%, 30%-40%, 40%-50%, 50%-60%, 60%-70%, 70%-80%, and 80%-90%) of exterior atoms of [2] the boron nitride nanotube structure clump, [3] the boron nitride nanotube structure/independent boron nitride nanotube clump, or [5] the boron nitride nanotube structure that is not in a clump, is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump, including any combination of the first percentages (or first range of percentages) and the second percentages (or second range of percentages).

As noted above, in accordance with a third aspect of the present inventive subject matter, there is provided a composition, comprising:

a plurality of independent boron nitride nanotubes, a sum of [1] a total mass of any independent hexagonal boron nitride in the composition and [2] a total mass of any residual boron in the composition accounts for not more than 35% of the mass of the composition.

In some embodiments according to the third aspect of the present inventive subject matter, which can include or not include, as suitable, any of the other features described herein:

a sum of [1] a total mass of any independent hexagonal boron nitride in the composition and [2] a total mass of any residual boron in the composition accounts for not more than a first percentage (selected from among 30%, 25%, 20%, 15%, 10%, and 5%), or accounts for a percentage that is within a first range of percentages (selected from among 30%-35%, 25%-30%, 20%-25%, 15%-20%, 10%-15%, and 5%-10%) of the mass of the composition.

As noted above, in accordance with a fourth aspect of the present inventive subject matter, there is provided an aggregate, comprising:

a one-piece structure comprising a plurality of independent boron nitride nanotubes, the one-piece structure having a first dimension of at least 100 nm and a second dimension of at least 100 nm, the second dimension perpendicular to the first dimension, a sum of [1] a total mass of independent hexagonal boron nitride in the one-piece structure and [2] a total mass of any residual boron in the one-piece structure accounts for not more than 35% of the mass of the one-piece structure.

In some embodiments according to the fourth aspect of the present inventive subject matter, which can include or not include, as suitable, any of the other features described herein:

a sum of [1] a total mass of any independent hexagonal boron nitride in the one-piece structure and [2] a total mass of any residual boron in the one-piece structure accounts for not more than a first percentage (selected from among 30%, 25%, 20%, 15%, 10%, and 5%), or accounts for a percentage that is within a first range of percentages (selected from among 30%-35%, 25%-30%, 20%-25%, 15%-20%, 10%-15%, and 5%-10%) of the mass of the one-piece structure.

As noted above, in accordance with a fifth aspect of the present inventive subject matter, there is provided a composition, comprising:

at least ten independent boron nitride nanotubes that have a length of at least 50 nm, among a sum of [1] the independent boron nitride nanotubes in the composition that have a length of at least 50 nm, and [2] boron nitride nanotube structures in the composition that have a length of at least 50 nm, not more than 1% of said sum have at least one defect selected from among dixie cup defects and bamboo defects.

Persons of skill in the art are familiar with dixie cup defects and bamboo defects. For definiteness, the expression "bamboo defect," as used herein with regard to a boron nitride nanotube, means that the boron nitride nanotube has plural regions in which a diameter of the boron nitride nanotube increases by at least 10% over a length of 5 nm or less (i.e., respective diameters of the boron nitride nanotube (i.e., diameters perpendicular to the axis of the boron nitride nanotube) that are spaced not more than 5 nm apart along the length of the boron nitride nanotube, differ by at least 10% (i.e., one diameter is at least 1.1 times the other diameter)).

For definiteness, the expression "dixie cup defect," as used herein with regard to a boron nitride nanotube (or a plurality of boron nitride nanotubes), means that the boron nitride nanotube (or each of the boron nitride nanotubes) is tapered, in that it has a first (wide) end and a second (narrow) end (spaced along the axis of the boron nitride nanotube or wall), with the second (narrow) end having a diameter (perpendicular to the axis) that is not more than 65% of the diameter of the first (wide) end, and in which the narrow end of the boron nitride nanotube is inside the wide end of another tapered boron nitride nanotube (i.e., a plane perpendicular to the axes of the boron nitride nanotubes and at a region of "dixie cup overlap" would pass through both boron nitride nanotubes.

In some embodiments according to the fifth aspect of the present inventive subject matter, which can include or not include, as suitable, any of the other features described herein:
    among a sum of [1] the independent boron nitride nanotubes in the composition that have a length of at least 50 nm, and [2] boron nitride nanotube structures in the composition that have a length of at least 50 nm, not more than a first percentage (selected from among 0.8%, 0.6%, 0.4%, 0.3%, 0.2% and 0.1%), or a percentage that is within a first range of percentages (selected from among 0.0%-0.1%, 0.1%-0.2%, 0.2%-0.3%, 0.3%-0.4%, 0.4%-0.6%, 0.6%-0.8%, and 0.8%-1.0%) of said sum have at least one defect selected from among dixie cup defects and bamboo defects.

As noted above, in accordance with a sixth aspect of the present inventive subject matter, there is provided an aggregate, comprising:
    a one-piece structure comprising a plurality of independent boron nitride nanotubes,
    the one-piece structure having a first dimension of at least 100 nm and a second dimension of at least 100 nm, the second dimension perpendicular to the first dimension,
    among a sum of [1] the independent boron nitride nanotubes in the one-piece structure that have a length of at least 50 nm, and [2] boron nitride nanotube structures in the one-piece structure that have a length of at least 50 nm, not more than 1% of said sum have at least one defect selected from among dixie cup defects and bamboo defects.

In some embodiments according to the sixth aspect of the present inventive subject matter, which can include or not include, as suitable, any of the other features described herein:
    among a sum of [1] the independent boron nitride nanotubes in the one-piece structure that have a length of at least 50 nm, and [2] boron nitride nanotube structures in the one-piece structure that have a length of at least 50 nm, not more than a first percentage (selected from among 0.8%, 0.6%, 0.4%, 0.3%, 0.2% and 0.1%), or a percentage that is within a first range of percentages (selected from among 0.0%-0.1%, 0.1%-0.2%, 0.2%-0.3%, 0.3%-0.4%, 0.4%-0.6%, 0.6%-0.8%, and 0.8%-1.0%) of said sum have at least one defect selected from among dixie cup defects and bamboo defects.

As noted above, in accordance with a seventh aspect of the present inventive subject matter, there is provided a composition, comprising:
    at least ten independent boron nitride nanotubes,
    among a sum of [1] the independent boron nitride nanotubes in the composition that have a length of at least 50 nm, and [2] boron nitride nanotube structures in the composition that have a length of at least 50 nm, each of at least 50% of said sum is single-wall.

In some embodiments according to the seventh aspect of the present inventive subject matter, which can include or not include, as suitable, any of the other features described herein, each of at least some of said sum of [1] the independent boron nitride nanotubes in the composition that have a length of at least 50 nm, and [2] the boron nitride nanotube structures in the composition that have a length of at least 50 nm, that is single-wall is in an independent boron nitride nanotube clump, a boron nitride nanotube structure clump, or a boron nitride nanotube structure/independent boron nitride nanotube clump.

In some embodiments according to the seventh aspect of the present inventive subject matter, which can include or not include, as suitable, any of the other features described herein, among a sum of [1] the independent boron nitride nanotubes in the composition that have a length of at least 50 nm, and [2] boron nitride nanotube structures in the composition that have a length of at least 50 nm, each of 50-60 percent of said sum is single-wall.

As noted above, in accordance with an eighth aspect of the present inventive subject matter, there is provided an aggregate, comprising:
    a one-piece structure comprising at least one independent boron nitride nanotube,
    the one-piece structure having a first dimension of at least 100 nm and a second dimension of at least 100 nm, the second dimension perpendicular to the first dimension,
    among a sum of [1] the independent boron nitride nanotubes in the one-piece structure that have a length of at least 50 nm, and [2] boron nitride nanotube structures in the one-piece structure that have a length of at least 50 nm, each of at least 50% of said sum is single-wall.

In some embodiments according to the eighth aspect of the present inventive subject matter, which can include or not include, as suitable, any of the other features described herein, each of at least some of said sum of [1] the independent boron nitride nanotubes in the one-piece structure that have a length of at least 50 nm, and [2] the boron nitride nanotube structures in the one-piece structure that have a length of at least 50 nm, that is single-wall is in an independent boron nitride nanotube clump, a boron nitride nanotube structure clump, or a boron nitride nanotube structure/independent boron nitride nanotube clump.

In some embodiments according to the eighth aspect of the present inventive subject matter, which can include or not include, as suitable, any of the other features described herein, among a sum of [1] the independent boron nitride nanotubes in the one-piece structure that have a length of at least 50 nm, and [2] boron nitride nanotube structures in the one-piece structure that have a length of at least 50 nm, each of 50-60 percent of said sum is single-wall.

In some embodiments according to any of the first, second, fifth, sixth, seventh and eighth aspects of the present inventive subject matter, which can include or not include, as suitable, any of the other features described herein, the combined mass of the epitaxial h-BN/BNNT structures in the composition accounts for at least 65% of the mass of the composition or one-piece structure (i.e., the composition with respect to the first, third, fifth and seventh aspects, and the one-piece structure with respect to the second, fourth, sixth and eighth aspects, and similarly below in other occurrences of "composition or one-piece structure"), and in some of such embodiments, the combined mass of the epitaxial h-BN/BNNT structures in the composition accounts for at least a first percentage (selected from among 70%, 75%, 80%, 85%, 90%, 95%, 97%, and 99%), or accounts for a percentage that is within a first range of percentages (selected from among 65%-70%, 70%-75%, 75%-80%, 80%-85%, 85%-90%, 90%-95%, 95%-97%, and 97%-99%) of the mass of the composition or one-piece structure.

In some embodiments according to any of the first, second, third, fourth, fifth, sixth, seventh and eighth aspects of the present inventive subject matter, which can include or not include, as suitable, any of the other features described herein, at least 10% by mass of the composition or one-piece structure comprises hexagonal boron nitride structures that are each epitaxial with respect to a boron nitride nanotube structure.

In some embodiments according to any of the first, second, third, fourth, fifth, sixth, seventh and eighth aspects of the present inventive subject matter, which can include or not include, as suitable, any of the other features described herein for each of at least 10% of the atoms in the composition or one-piece structure, the atom is in a hexagonal boron nitride structure that is epitaxial with a boron nitride nanotube structure in the composition.

In some embodiments according to either of the first and second aspects of the present inventive subject matter, which can include or not include, as suitable, any of the other features described herein, the combined mass of any independent hexagonal boron nitride in the composition or one-piece structure and [2] the combined mass of any amorphous boron in the composition or one-piece structure accounts for less than 35% of the mass of the composition or one-piece structure, and in some of such embodiments, the combined mass of any independent hexagonal boron nitride in the composition or one-piece structure and [2] the combined mass of any amorphous boron in the composition or one-piece structure accounts for less than a first percentage (selected from among 30%, 25%, 20%, 15%, 10% and 5%), or accounts for a percentage that is within a first range of percentages (selected from among 10%-20%, 20%-30%, 30%-40%, 40%-50%, 50%-60%, 60%-70%, 70%-80%, and 80%-90%) 35% of the mass of the composition or one-piece structure.

In some embodiments according to any of the first, second, third and fourth aspects of the present inventive subject matter, which can include or not include, as suitable, any of the other features described herein, a sum of [1] the independent boron nitride nanotubes in the composition or one-piece structure that have a length of at least 50 nm, and [2] boron nitride nanotube structures in the composition or one-piece structure that have a length of at least 50 nm, not more than 1% of said sum have at least one defect selected from among dixie cup defects and bamboo defects, and In some of such embodiments, a sum of [1] the independent boron nitride nanotubes in the composition or one-piece structure that have a length of at least 50 nm, and [2] boron nitride nanotube structures in the composition or one-piece structure that have a length of at least 50 nm, not more than a first percentage (selected from among 0.8%, 0.6%, 0.4%, 0.3%, 0.2% and 0.1%), or a percentage that is within a first range of percentages (selected from among 0.0%-0.1%, 0.1%-0.2%, 0.2%-0.3%, 0.3%-0.4%, 0.4%-0.6%, 0.6%-0.8%, and 0.8%-1.0%) of said sum have at least one defect selected from among dixie cup defects and bamboo defects.

In some embodiments according to any of the first, second, third, fourth, fifth and sixth aspects of the present inventive subject matter, which can include or not include, as suitable, any of the other features described herein, a sum of [1] the independent boron nitride nanotubes in the composition or one-piece structure that have a length of at least 50 nm, and [2] boron nitride nanotube structures in the composition or one-piece structure that have a length of at least 50 nm, each of at least 50% of said sum is single-wall.

Figure 2:
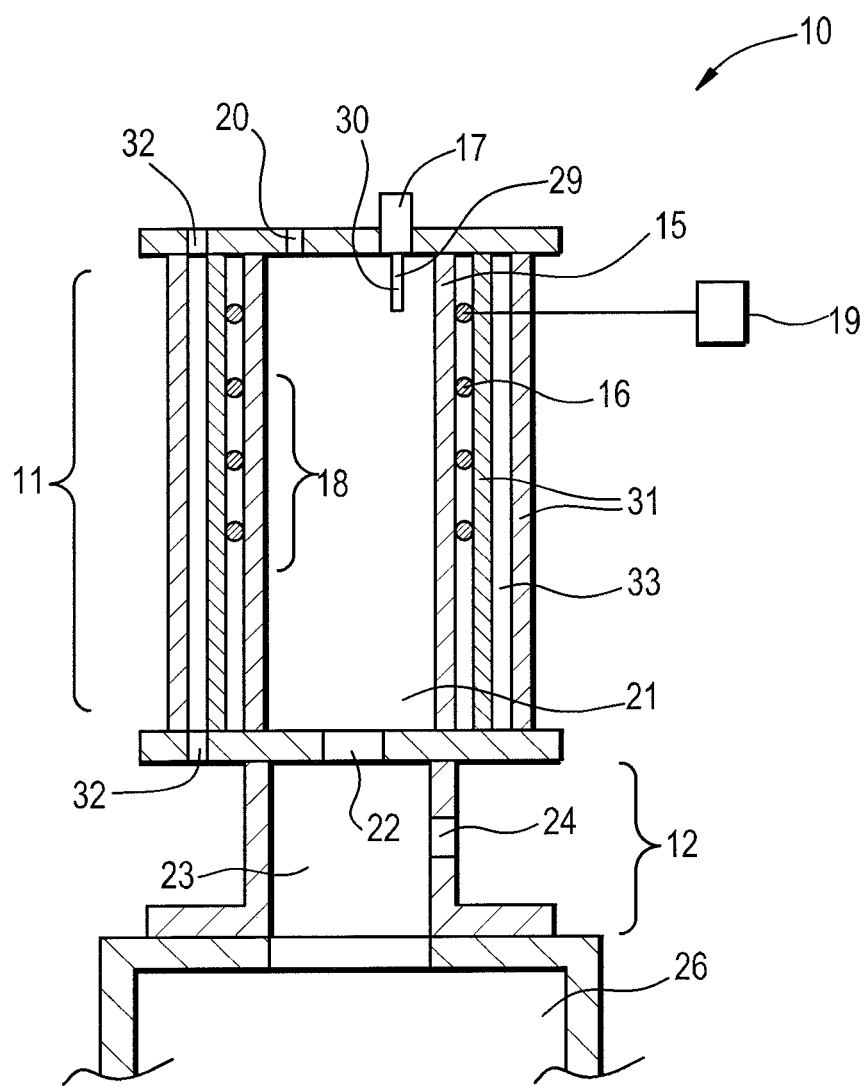
FIG. 2 is an enlarged portion of FIG. 1.

In some embodiments according to either of the third and fourth aspects of the present inventive subject matter, which can include or not include, as suitable, any of the other features described herein, independent hexagonal boron nitride accounts for not more than 1 percent by mass of the composition or aggregate, and in some of such embodiments, independent hexagonal boron nitride accounts for not more than first percentage (selected from among 0.8%, 0.6%, 0.4%, 0.3%, 0.2% and 0.1%), or accounts for a percentage that is within a first range of percentages (selected from among 0.0%-0.1%, 0.1%-0.2%, 0.2%-0.3%, 0.3%-0.4%, 0.4%-0.6%, 0.6%-0.8%, and 0.8%-1.0%) by mass of the composition or aggregate FIG. 1 schematically depicts a representative embodiment of an apparatus 10 that can be used to make epitaxial h-BN/BNNT structures, as well as compositions and/or aggregates that comprise epitaxial h-BN/BNNT structures, in accordance with the first and second aspects of the present inventive subject matter. FIG. 2 is an enlarged portion of FIG. 1, showing portions of the apparatus 10.

The apparatus 10 comprises a plasma generator 11, a collar region 12, a first reactor section 13 (which defines a first reaction chamber region) and a second reactor section 14 (which defines a second reaction chamber region).

The plasma generator 11 comprises a wall 15, an electromagnetic wave generator and waveguide 16 and a sparker 17. The waveguide is an inductor, and is in the form of coil with several turns (normally from three to six), e.g., of copper tubing (¼" and up). A copper coil is a non-magnetic coil that provides high electrical conductivity. A number of turns is defined to match the inductor's inductance and electrical resistance, which provides matching with the high-frequency power supply output.

The wall 15 of the plasma generator 11 comprises an RF-transparent region 18 that is radio frequency-transparent (i.e., RF-transparent), electrically conductive and non-magnetic. A representative example of a suitable material out of which the RF-transparent region 18 can be made is alumina.

An AC power supply 19 supplies radio frequency energy to the electromagnetic wave generator 16, which generates electromagnetic waves at a plurality of frequencies selected from within a range of tens of kilohertz to thousands of gigahertz, and such electromagnetic waves pass through the RF-transparent portion 18 of the wall 15 of the plasma generation region 11.

A plasma generator space 21 is inside the plasma generator 11.

The sparker 17 comprises a movable electrode 29 and a discharge protrusion 30. The movable electrode 29 is configured to controllably extend into a region of the plasma generator space 21 that comprises maximal magnetic field density and maximum electric field density. The discharge protrusion 30 is made of electrically conductive, non-magnetic material and is configured to create a discharge point when approached by the movable electrode 29, such discharge creating a plasma. The movable electrode 29 is configured to retract out of the region of maximal magnetic field density and maximum electric field density after such discharge.

The plasma generator 11 has one or more ports 20 through which materials (e.g., nitrogen gas) can be introduced into the plasma generator space 21.

The plasma generator 11 has a plume opening 22 through which a plume of plasma generated in the plasma generator 11 enters a collar space 23 inside the collar region 12.

The collar region 12 comprises at least one reactant feed opening 24 through which feedstock (e.g., boron powder, boron nitride, boron carbide, boron trioxide, boric acid, etc.), optionally along with a carrier gas, can be introduced (e.g., injected) into the collar space 23 (and into the plasma plume).

The first reactor section 13 can comprise one or more access ports 25 to provide access to the first reaction chamber region 26 inside the first reactor section 13. The one or more access ports 25 (if included) can provide access for diagnostics (such as optical monitoring of the reaction), for inserting structures into the reaction chamber (e.g., quench modifiers, such as wires or meshes), or for removing product.

Similarly, the second reactor section 14 can comprise one or more access ports 27 to provide access to the second reaction chamber region 28 inside the second reactor section 14. The one or more access ports 27 (if included) can provide access for diagnostics (such as optical monitoring of the reaction), for inserting structures into the reaction chamber (e.g., quench modifiers, such as wires or meshes), or for removing product.

The apparatus 10 further comprises an outer shell 31 outside the plasma generator 11 to enable cooling and/or to provide gas/liquid sealing. In the embodiment depicted in FIG. 1, the outer shell 31 is substantially coaxial with respect to the plasma generator 11, with the plasma generator 11 as an inner tube and the outer shell 31 as an outer tube. Holes 32 at the ends of the outer shell 31 enable coolant, e.g. water, to flow into the bottom (in the orientation depicted) of a chamber 33 within the outer shell 31 and out the top of the chamber 33. The outer shell 31 also assists in sealing the plasma generator 11, thereby assisting in avoiding or reducing any plasma and gas leakage. The outer shell 31 is preferably RF-transparent. Representative examples of suitable materials out of which the outer shell 31 can be made include quartz and ceramic materials.

In some embodiments, product can be removed from the first reaction chamber region 26 and/or the second reaction chamber region 28 continuously or semi-continuously (e.g., by a conveyor that carries product out of the first reaction chamber region 26 and/or the second reaction chamber region 28) (i.e., rather than batch) operation.

An exit port 34 is formed in the second reactor section 14, and a first exhaust line 35 is connected to the exit port 34. A pressure regulator 36 is connected to the first exhaust line 35, and a second exhaust line 37 is connected to the pressure regulator 36, whereby gases (e.g., nitrogen, argon and hydrogen) can be exhausted and the pressure within the first and second reaction chamber regions 26 and 28 can be regulated. Any suitable pressure regulator (e.g., a needle valve) can be employed as the pressure regulator 36.

In the discussion above, the plasma generator is an inductively coupled plasma generator. As an alternative, the plasma generator may instead be a DC arc plasma generator (i.e., a plasma generator driven by a DC power source). Persons of skill in the art are familiar with DC arc plasma generators, and any such plasma generator arrangement can be use. In some embodiments, an inductively coupled plasma generator is advantageous (relative to a DC arc plasma generator) in the fabrication of compositions and/or aggregates that comprise boron nitride nanotubes with hexagonal boron nitride structures that are epitaxial with respect to a boron nitride nanotube, because an inductively coupled plasma generator provides larger plasma volume, lower plasma gas velocity, and longer reaction time. In addition, due to the absence of electrodes in an inductively coupled plasma generator, an inductively coupled plasma generator may be relatively maintenance free and (unlike a DC arc plasma generator, which must include electrodes) does not introduce contamination from electrodes in the materials being fabricated.

The power density and volume of the plasma plume are adjustable by varying the input power to the plasma generator, by varying the pressure within the plasma generator space 21, and/or by varying the flow rates of materials supplied to the apparatus 10 (e.g., nitrogen gas, boron powder with nitrogen gas carrier, etc.).

The apparatus 10 depicted in FIG. 1 can also be used to make:

compositions (or aggregates) that comprise a plurality of independent boron nitride nanotubes, in which a sum of [1] a total mass of any independent hexagonal boron nitride in the composition (or aggregate) and [2] a total mass of any residual boron in the composition (or aggregate) accounts for not more than 35% of the mass of the composition (or aggregate), in accordance with the third aspect (or the fourth aspect) of the present inventive subject matter;

compositions (or aggregates) that comprise at least ten independent boron nitride nanotubes that have a length of at least 50 nm, in which among a sum of [1] the independent boron nitride nanotubes in the composition (or aggregate) that have a length of at least 50 nm, and [2] boron nitride nanotube structures in the composition (or aggregate) that have a length of at least 50 nm, not more than 1% of said sum have at least one defect selected from among dixie cup defects and bamboo defects, in accordance with the fifth aspect (or the sixth aspect) of the present inventive subject matter; and compositions (or aggregates) that comprise at least ten independent boron nitride nanotubes, in which among a sum of [1] the independent boron nitride nanotubes in the composition (or aggregate) that have a length of at least 50 nm, and [2] boron nitride nanotube structures in the composition (or aggregate) that have a length of at least 50 nm, each of at least 50% of said sum is single-wall, in accordance with the seventh aspect (or the eighth aspect) of the present inventive subject matter.

One specific representative embodiment of a method by which epitaxial h-BN/BNNT structure in accordance with the first aspect of the present inventive subject matter can be made comprises:

supplying 50 liters per minute of a mixture of nitrogen and hydrogen (96 parts by mass nitrogen and 4 parts by mass hydrogen) into a plasma generator space 21 of an apparatus 10 as depicted in FIG. 1 (through a port 20 of an apparatus 10 as depicted in FIG. 1), the apparatus further characterized in that the outside diameter of the plasma generator 11 is 3.5 inches, the inside diameter of the plasma generator 11 is 2.0 inches, the length of the plasma generator 11 (vertical in the orientation depicted in FIG. 1) is 10.0 inches, the outside diameter of the collar region 12 is 3.5 inches, the inside diameter of the collar region 12 is 1.40 inches, the length of the collar region 12 (vertical in the orientation depicted in FIG. 1) is 3.0 inches, the diameter of the plume opening 22 (connection section between the plasma generator space 21 and the collar space 23) is 1.38 inches, the reactant feed opening 24 is halfway along the length of the collar region 12, the inside diameter of the first reactor section 13 is 8.0 inches, the length of the first reactor section 13 (vertical in the orientation depicted in FIG. 1) is 24 inches, the inside diameter of the second reactor section 14 is 8.0 inches, the length of the second reactor section 14 (vertical in the orientation depicted in FIG. 1) is 24 inches (i.e., the first reactor section 13 and the second reactor section 14 together define a cylindrical chamber region of uniform diameter, which is a combination of the first reaction chamber region 26 and the second reaction chamber region 28, and that is 8 inches in diameter and 48 inches in length), and the diameter of the reactant feed opening 24 is 1/16 inch;

ionizing nitrogen and hydrogen in the plasma generator space 21 by supplying 35-45 kW to the electromagnetic wave generator 16; and supplying into the collar space (via the reactant feed opening 24, at a location at which the highest temperatures within the apparatus 10 are) 20-90 mg/minute of solid elemental boron powder (at room temperature before entering the apparatus 10) entrained in nitrogen gas (e.g., 0.1 to 10.0 liters per minute), while maintaining the pressure within the first reactor section 13 and the second reactor section 14 in the range of from 10 psi to 20 psi (the pressure can fluctuate within this range).

In this representative embodiment, the temperature within at least part of the collar region 12 is about 8,000 K, the heat provided by the plasma, while temperatures in the first reactor section 13 and the second reactor section 14 are lower at farther distances from the collar region 12.

The epitaxial h-BN/BNNT structures in accordance with the present inventive subject matter resemble rock candy, in which (continuing with the analogy) a boron nitride nanotube structure is the string, and nucleated and grown hexagonal boron nitride is the sugar.

Boron and nitrogen ions that are not transformed to boron nitride nanotube structures in the hottest zone of the apparatus are supersaturated in the apparatus, and they build up on the boron nitride nanotube structures, where they nucleate hexagonal boron nitride structures on boron nitride nanotube structures (i.e., making a structure having boron and nitrogen atoms nucleated on a boron nitride nanotube structure) and/or grow on previously nucleated boron nitride structures.

Diameters of boron nitride nanotube structures formed in accordance with the above representative embodiment are generally (e.g., 90% or more of them) in the range of from 3 to 30 nm.

Lengths of boron nitride nanotube structures formed in accordance with the above representative embodiment are generally (e.g., 90% or more of them) in the range of from 10 nm to 50 micrometers.

Nodules of hexagonal boron nitride that is epitaxial with and covering boron nitride nanotube structures formed in accordance with the above representative embodiment are generally (e.g., 90% or more of them) 1 nm to 200 nm thick (and are easy to identify, e.g., in TEM images).

Portions of boron nitride nanotube structures that are not covered by hexagonal boron nitride structures, and independent boron nitride nanotubes (if present), are very smooth and easy to identify (e.g., in transmission electron microscopy images (i.e., TEM images)).

Portions of residual boron (in products of the representative embodiment described above) are generally amorphous (and are easy to identify, e.g., in TEM images). A representative product comprises 65 parts by mass of epitaxial h-BN/BNNT structures, and 35 parts by mass of residual boron and/or independent hexagonal boron nitride (typically including less than 1 part by mass of independent hexagonal boron nitride).

Figure 3:
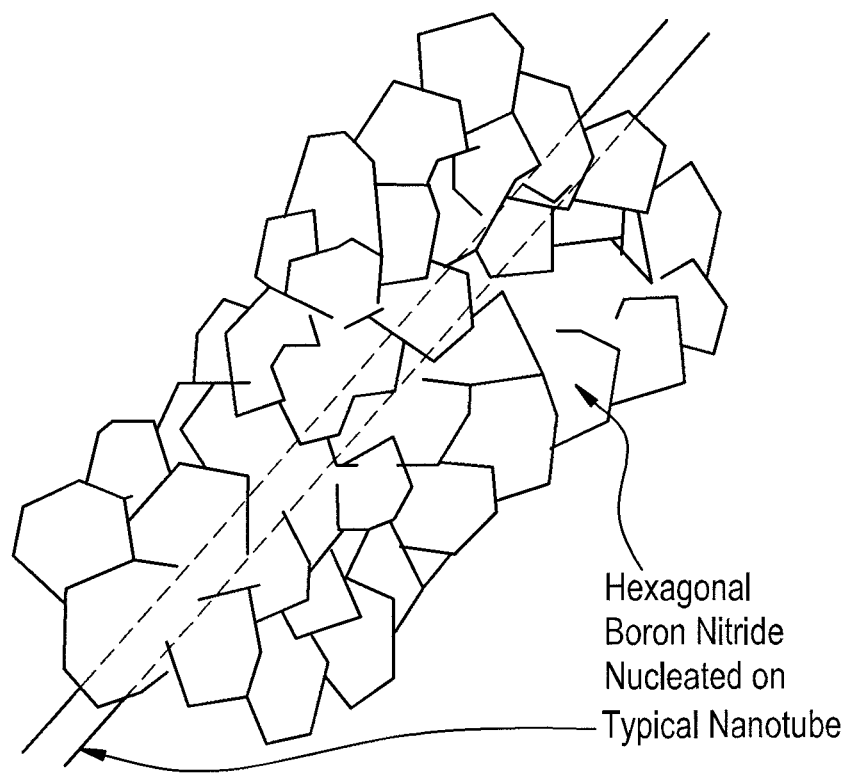
FIG. 3 is an illustration of an epitaxial h-BN/BNNT structure

Products in accordance with the present inventive subject matter exhibit numerous properties that make them useful in a variety of applications. For example, epitaxial h-BN/BNNT structures are thicker than corresponding independent boron nitride nanotubes, and/or have a more rough exterior, such that epitaxial h-BN/BNNT structures readily adhere to a matrix material, i.e., can provide physical/mechanical resistance to removal from a matrix material (FIG. 3 is an illustration of an epitaxial h-BN/BNNT structure).

In addition, epitaxial h-BN/BNNT structures provide nano-nucleation sites for metals to crystallize (e.g., if casting metal, such as aluminum, magnesium or titanium, which have melting points that are lower than the temperature at which BNNT's degrade).

In addition, epitaxial h-BN/BNNT structures provide excellent properties after being subjected to extremely high temperatures (in some cases, hexagonal boron nitride can act as a sacrificial layer for a boron nitride structure that it covers).

Some embodiments of epitaxial h-BN/BNNT structures in accordance with the present inventive subject matter provide any combinations of the above-described advantageous properties.

In general, increasing (i.e., above 4 weight percent) the proportion of hydrogen in the mixture of nitrogen and hydrogen supplied into the port 20 of the apparatus 10 increases the amount of epitaxial hexagonal boron nitride structures that are formed, and decreasing the proportion of hydrogen (i.e., below 4 weight percent) in the mixture of nitrogen and hydrogen supplied into the port 20 of the apparatus 10 decreases the amount of epitaxial hexagonal boron nitride structures that are formed). While the present inventive subject matter is not limited to any particular theory, it is believed that the hydrogen supplied in the mixture supplied into the port 20 provides energy that assists in the nucleation of hexagonal boron nitride structures on boron nitride nanotube structures.

Supplying solid elemental boron powder entrained in 0.1 to 10.0 liters per minute of nitrogen gas into the collar space via the reactant feed opening 24 (having a diameter of 1/16 inch) equates to a nitrogen gas flow rate of about 53.3 cm/sec-5,330 cm/sec. While the present inventive subject matter is not limited to any particular theory, it is believed that this high nitrogen gas flow rate causes a significant amount of boron to pass unreacted through the region in which boron nitride nanotube structures are being formed, thereby providing boron that can be involved in nucleating hexagonal boron nitride on the thus-formed boron nitride nanotube structures.

In the event that a larger apparatus were employed, the nitrogen gas flow rate in which the boron feed is entrained would be increased to adjust for the larger reaction zone through which hydrogen and boron would pass through unreacted. Similarly, in the event that larger a flow rate of nitrogen and hydrogen is supplied to the plasma generator space 21 (e.g., in a larger apparatus), the power supplied to the electromagnetic wave generator 16 would be increased sufficiently to ionize nitrogen and hydrogen.

While the present inventive subject matter is not limited to any particular theory, it is believed that the constriction of the reduced diameter of the plume opening in creating flow characteristics that lead to production of epitaxial h-BN/BNNT structures. It is believed that the smaller diameter in the collar space 23, in comparison to the larger diameter in the first reaction chamber region 26, also contributes to (or provides) flow characteristics that leads to the production of epitaxial h-BN/BNNT structures.

The above-described representative embodiment of a method also can be used to make compositions (or aggregates) that:

comprise a plurality of independent boron nitride nanotubes, in which a sum of [1] a total mass of any independent hexagonal boron nitride in the composition (or aggregate) and [2] a total mass of any residual boron in the composition (or aggregate) accounts for not more than 35% of the mass of the composition (or aggregate), in accordance with the third aspect (or the fourth aspect) of the present inventive subject matter;

comprise at least ten independent boron nitride nanotubes that have a length of at least 50 nm, in which among a sum of [1] the independent boron nitride nanotubes in the composition (or aggregate) that have a length of at least 50 nm, and [2] boron nitride nanotube structures in the composition (or aggregate) that have a length of at least 50 nm, not more than 1% of said sum have at least one defect selected from among dixie cup defects and bamboo defects, in accordance with the fifth aspect (or the sixth aspect) of the present inventive subject matter; and/or comprise at least ten independent boron nitride nanotubes, in which among a sum of [1] the independent boron nitride nanotubes in the composition (or aggregate) that have a length of at least 50 nm, and [2] boron nitride nanotube structures in the composition (or aggregate) that have a length of at least 50 nm, each of at least 50% of said sum is single-wall, in accordance with the seventh aspect (or the eighth aspect) of the present inventive subject matter.

Thus, in addition, the present inventive subject matter provides compositions (and aggregates):

that have advantageous high purity, e.g., in which a sum of [1] a total mass of any independent hexagonal boron nitride in the composition (or aggregate) and [2] a total mass of any residual boron in the composition (or aggregate) accounts for not more than 35% of the mass of the composition (or aggregate);

that have advantageous high quality, in which among a sum of [1] the independent boron nitride nanotubes in the composition (or aggregate) that have a length of at least 50 nm, and [2] boron nitride nanotube structures in the composition (or aggregate) that have a length of at least 50 nm, not more than 1% of said sum have at least one defect selected from among dixie cup defects and bamboo defects; and/or that have an advantageously high percentage of independent boron nitride nanotubes and boron nitride nanotube structures are single-wall, e.g., in which among a sum of [1] the independent boron nitride nanotubes in the composition (or aggregate) that have a length of at least 50 nm, and [2] boron nitride nanotube structures in the composition (or aggregate) that have a length of at least 50 nm, each of at least 50% of said sum is single-wall.

Such compositions or aggregates can have any combination of the above-described advantageous characteristics, and can also have any of the above-described advantageous characteristics of epitaxial h-BN/BNNT structures in accordance with the present inventive subject matter.

As noted above, in accordance with a ninth aspect of the present inventive subject matter, there is provided a method of making a composition, comprising:

supplying to a first region of a chamber a mixture of nitrogen gas and hydrogen gas;

converting at least a portion of the mixture of nitrogen gas and hydrogen gas to plasma;

supplying to a second region of the chamber a mixture of at least one boron-containing material and nitrogen gas, whereby the mixture of at least one boron-containing material and nitrogen gas contacts the plasma to form a reaction mixture;

converting at least a portion of the mixture to epitaxial h-BN/BNNT structures.

In some embodiments according to the ninth aspect of the present inventive subject matter, which can include or not include, as suitable, any of the other features described herein, the chamber comprises:

the first region;

the second region;

at least a third region;

a first connection section providing communication between the first region and the second region; and a second connection section providing communication between the second region and the third region, the first region having at least one first region cross-sectional area perpendicular to an axis of the chamber, the axis of the chamber extending through the first region, the second region and the third region, the second region having at least one second region cross-sectional area perpendicular to the axis of the chamber, the third region having at least one third region cross-sectional area perpendicular to the axis of the chamber, the first connection section having at least one first connection section cross-sectional area perpendicular to the axis of the chamber, the second connection section having at least one second connection section cross-sectional area perpendicular to the axis of the chamber, each first connection section cross-sectional area smaller than the first region cross-sectional area and smaller than the second region cross-sectional area, each second connection section cross-sectional area smaller than the third region cross-sectional area, and in some of such embodiments:

pressure within at least a portion of the third region is at least 10 psi;

pressure within at least a portion of the third region is in the range of 10-20 psi; and/or pressure within at least a portion of the third region is in the range of 15-20 psi.

In some embodiments according to the ninth aspect of the present inventive subject matter, which can include or not include, as suitable, any of the other features described herein, the weight percentage of hydrogen gas in the mixture of nitrogen gas and hydrogen gas is in the range of from 1 percent by mass to 7 percent by mass (in some embodiments at least 2 percent by mass, in some embodiments in the range of 2 percent by mass to 7 percent by mass, in some embodiments 4 percent by mass or about 4.0 percent by mass.

In some embodiments according to the ninth aspect of the present inventive subject matter, which can include or not include, as suitable, any of the other features described herein, the weight percentage of hydrogen gas in the mixture of nitrogen gas and hydrogen gas is at least 3 percent by mass.

In some embodiments according to the ninth aspect of the present inventive subject matter, which can include or not include, as suitable, any of the other features described herein, the weight percentage of hydrogen gas in the mixture of nitrogen gas and hydrogen gas is at least 4 percent by mass.

In some embodiments according to the ninth aspect of the present inventive subject matter, which can include or not include, as suitable, any of the other features described herein, the mixture of nitrogen gas and hydrogen gas is supplied to the first region in an amount of at least 30 liters per minute.

In some embodiments according to the ninth aspect of the present inventive subject matter, which can include or not include, as suitable, any of the other features described herein, the mixture of nitrogen gas and hydrogen gas is supplied to the first region in an amount of at least 40 liters per minute.

In some embodiments according to the ninth aspect of the present inventive subject matter, which can include or not include, as suitable, any of the other features described herein, the mixture of nitrogen gas and hydrogen gas is supplied to the first region in an amount of at least 50 liters per minute.

In some embodiments according to the ninth aspect of the present inventive subject matter, which can include or not include, as suitable, any of the other features described herein, said supplying to a second region of the chamber of a mixture of at least one boron-containing material and nitrogen gas comprises supplying boron at a rate of at least 20 mg/minute.

In some embodiments according to the ninth aspect of the present inventive subject matter, which can include or not include, as suitable, any of the other features described herein, said supplying to a second region of the chamber of a mixture of at least one boron-containing material and nitrogen gas comprises supplying boron at a rate in the range of from 20 mg/minute to 90 mg/minute.

In some embodiments according to the ninth aspect of the present inventive subject matter, which can include or not include, as suitable, any of the other features described herein, said supplying to a second region of the chamber of a mixture of at least one boron-containing material and nitrogen gas comprises supplying nitrogen gas at a rate in the range of from 0.1 liters per minute to 1.3 liters per minute.

In some embodiments according to the ninth aspect of the present inventive subject matter, which can include or not include, as suitable, any of the other features described herein, said supplying to a second region of the chamber of a mixture of at least one boron-containing material and nitrogen gas comprises supplying nitrogen gas at a rate in the range of from 1.3 liters per minute to 8.4 liters per minute.

In some embodiments according to the ninth aspect of the present inventive subject matter, which can include or not include, as suitable, any of the other features described herein, said converting at least a portion of the mixture of nitrogen gas and hydrogen gas to plasma comprises generating electromagnetic waves within the first region.

In some embodiments according to the ninth aspect of the present inventive subject matter, which can include or not include, as suitable, any of the other features described herein, said generating electromagnetic waves comprises supplying radio frequency energy to an electromagnetic wave generator at a power rate of at least 35 kW (and in some embodiments, 35-45 kW).

In some embodiments according to the ninth aspect of the present inventive subject matter, which can include or not include, as suitable, any of the other features described herein, said generating electromagnetic waves comprises supplying radio frequency energy to an electromagnetic wave generator at a power rate of at least 39 (and in some embodiments, 39-45 kW).

In some embodiments according to the ninth aspect of the present inventive subject matter, which can include or not include, as suitable, any of the other features described herein, pressure within at least a portion of the chamber is at least 10 psi.

In some embodiments according to the ninth aspect of the present inventive subject matter, which can include or not include, as suitable, any of the other features described herein, pressure within at least a portion of the chamber is in the range of 10-20 psi.

In some embodiments according to the ninth aspect of the present inventive subject matter, which can include or not include, as suitable, any of the other features described herein, pressure within at least a portion of the chamber is in the range of 15-20 psi.

In some embodiments according to the ninth aspect of the present inventive subject matter, which can include or not include, as suitable, any of the other features described herein, the method further comprises contacting at least some of the epitaxial h-BN/BNNT structures with nitric acid, and in some of such embodiments, the method further comprises subjecting at least some of the epitaxial h-BN/BNNT structures to a temperature in the range of from 700 to 900 degrees C.

In some embodiments according to the ninth aspect of the present inventive subject matter, which can include or not include, as suitable, any of the other features described herein, the method further comprises subjecting at least some of the epitaxial h-BN/BNNT structures to a temperature in the range of from 700 to 900 degrees C.

Example 1

50 liters per minute of a mixture of nitrogen and hydrogen (96 parts by mass nitrogen and 4 parts by mass hydrogen) was supplied into a plasma generator space of an apparatus as depicted in FIG. 1 (through the port). The apparatus further characterized in that the outside diameter of the plasma generator was 3.5 inches, the inside diameter of the plasma generator was 2.0 inches, the length of the plasma generator was 10.0 inches, the outside diameter of the collar region was 3.5 inches, the inside diameter of the collar region was 1.40 inches, the length of the collar region was 3.0 inches, the diameter of the plume opening (connection section between the plasma generator space and the collar space) was 1.38 inches, the reactant feed opening was halfway along the length of the collar region, the inside diameter of the first reactor section was 8.0 inches, the length of the first reactor section was 24 inches, the inside diameter of the second reactor section was 8.0 inches, the length of the second reactor section was 24 inches, and the diameter of the reactant feed opening was 1/16 inch;

39 kW was supplied to the electromagnetic wave generator to ionize nitrogen and hydrogen in the plasma generator space;

22 mg/minute of solid elemental boron powder (at room temperature before entering the apparatus) entrained in 1.3 liters per minute of nitrogen gas was supplied into the collar space via the reactant feed opening;

the pressure within the first reactor section and the second reactor section was maintained in the range of from 15 psi to 20 psi (i.e., the pressure fluctuated within this range), and the temperature within at least part of the collar region was about 8,000 K.

Figure 4:
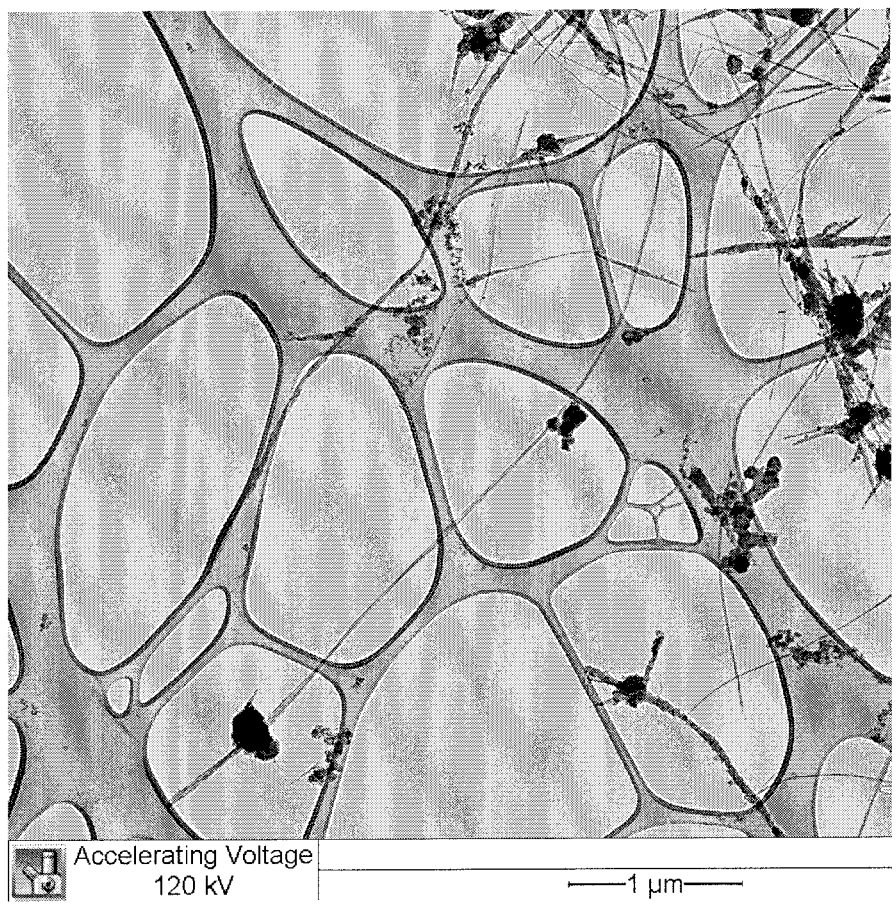
FIG. 4 is a TEM image of a representative portion of the product of Example 1, in which each of about 30% of the boron nitride nanotube structures were at least 30% covered by epitaxial hexagonal boron nitride.

FIG. 4 is a TEM image of a representative portion of the product of Example 1, in which each of about 30% of the boron nitride nanotube structures were at least 30% covered by epitaxial hexagonal boron nitride.

More than 50% of a sum of the independent boron nitride nanotubes and the boron nitride nanotube structures were single-wall, with the remainder double-wall and multi-wall.

Less than 1% of a sum of the independent boron nitride nanotubes and the boron nitride nanotube structures had dixie cup defects or banboo defects.

A sum of the mass of residual boron and independent hexagonal boron nitride was less than 35% by mass of the product.

Example 2

50 liters per minute of a mixture of nitrogen and hydrogen (96 parts by mass nitrogen and 4 parts by mass hydrogen) was supplied (through the port) into a plasma generator space of the same apparatus that was used in Example 1;

39 kW was supplied to the electromagnetic wave generator to ionize nitrogen and hydrogen in the plasma generator space;

22 mg/minute of solid elemental boron powder (at room temperature before entering the apparatus) entrained in 8.4 liters per minute of nitrogen gas was supplied into the collar space via the reactant feed opening;

the pressure within the first reactor section and the second reactor section was maintained in the range of from 15 psi to 20 psi (i.e., the pressure fluctuated within this range), and the temperature within at least part of the collar region was about 8,000 K.

Figure 5:
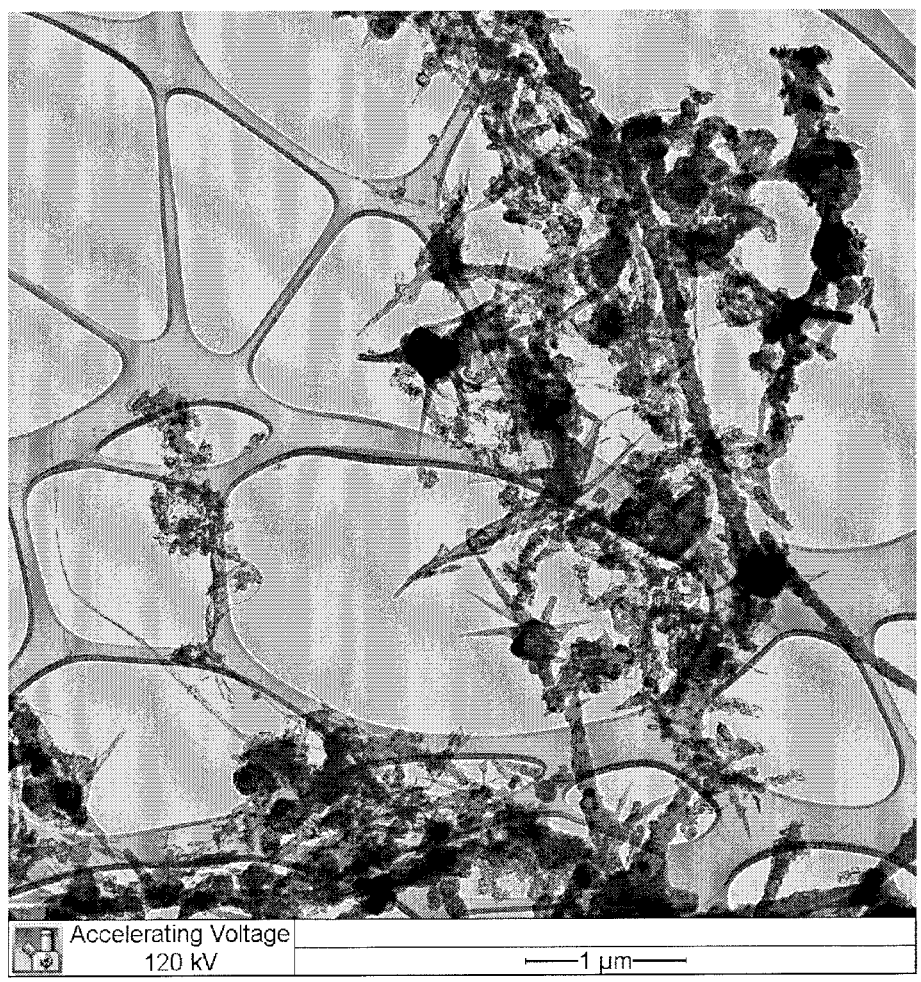
FIG. 5 is a TEM image of a representative portion of the product of Example 2, in which each of about 90% of the boron nitride nanotube structures were at least 30% covered by epitaxial hexagonal boron nitride.

FIG. 5 is a TEM image of a representative portion of the product of Example 2, in which each of about 90% of the boron nitride nanotube structures were at least 30% covered by epitaxial hexagonal boron nitride.

Figure 6:
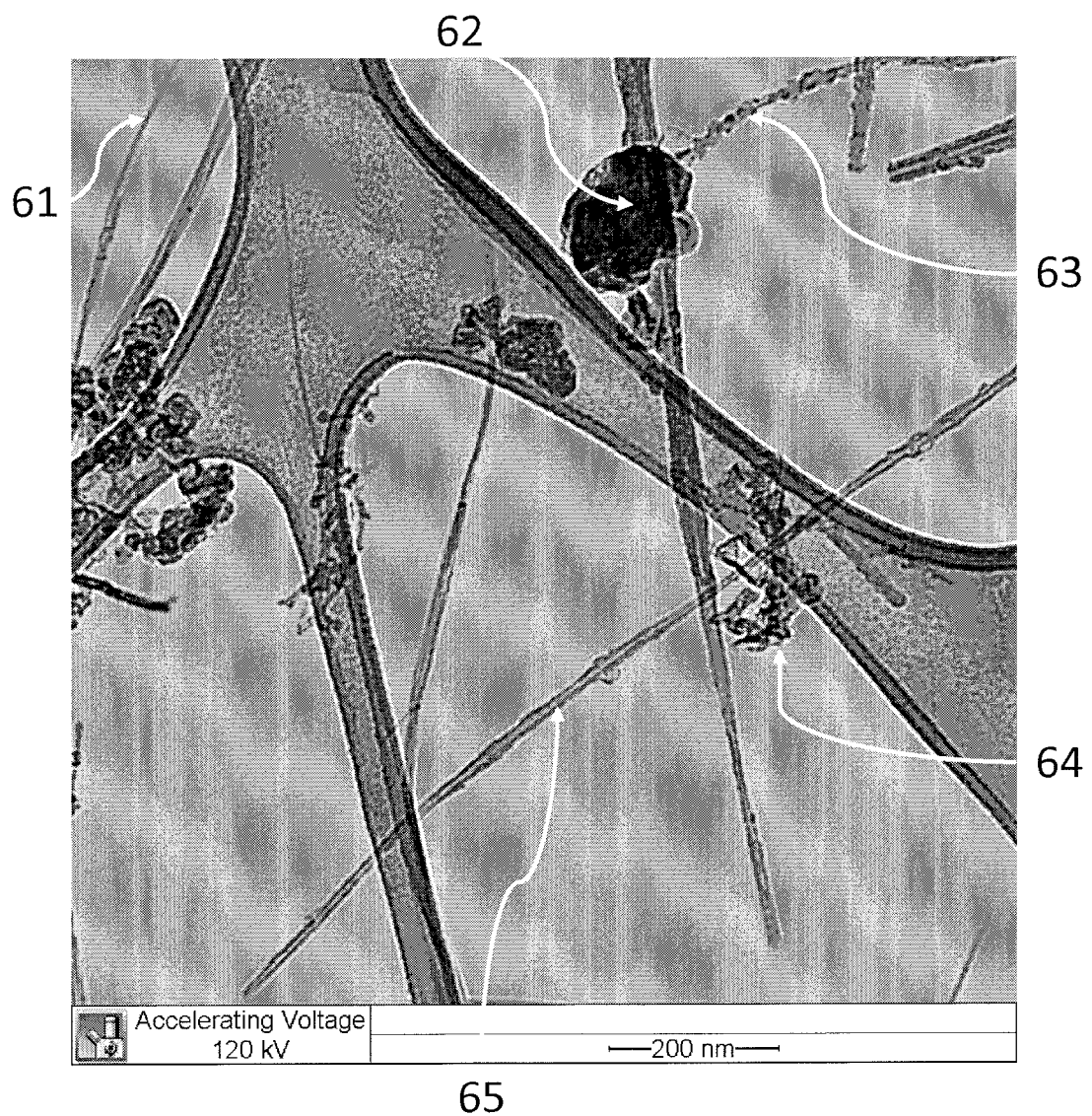
FIG. 6 is a TEM image of a portion of the product of Example 2, the image showing (inter alia) epitaxial h-BN/BNNT structures.

FIG. 6 is a TEM image of a portion of the product of Example 2, the image showing epitaxial h-BN/BNNT structures.

Reference number 61 points to an example of a high purity and high quality boron nitride nanotube in the TEM image of FIG. 6.

Reference number 62 points to an example of unreacted amorphous boron in the TEM image of FIG. 6.

Reference numbers 63, 64 and 65 point to examples of epitaxial h-BN/BNNT structures in the TEM image of FIG. 6.

Figure 7:
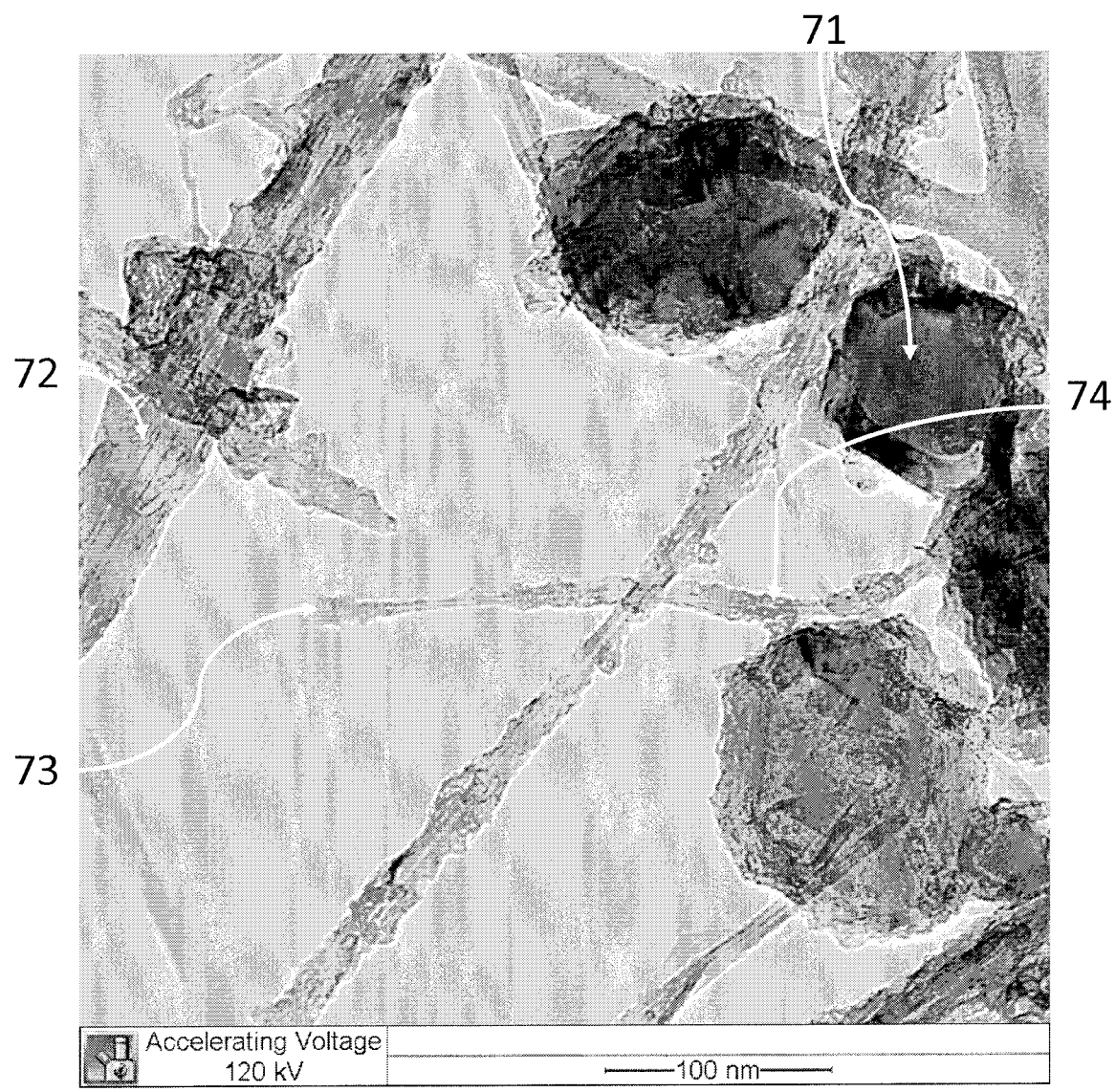
FIG. 7 is a TEM image of a portion of the product of Example 2, the image showing (inter alia) independent hexagonal boron nitride and epitaxial h-BN/BNNT structures (one of which comprises a clump of boron nitride nanotube structures).

FIG. 7 is a TEM image of a portion of the product of Example 2, the image showing an independent hexagonal boron nitride, epitaxial h-BN/BNNT structures (one of which comprises a clump of boron nitride nanotube structures).

Reference number 71 points to an example of an independent hexagonal boron nitride structure in the TEM image of FIG. 7.

Reference number 72 points to an example of an epitaxial h-BN/BNNT structure (comprising a clump of boron nitride nanotube structures) in the TEM image of FIG. 7.

Reference number 73 points to an example of an epitaxial h-BN/BNNT structure (comprising a single boron nitride nanotube structure) in the TEM image of FIG. 7.

Reference number 74 points to an example of an epitaxial h-BN/BNNT structure (comprising a clump of two boron nitride nanotube structures) in the TEM image of FIG. 7.

Figure 8:
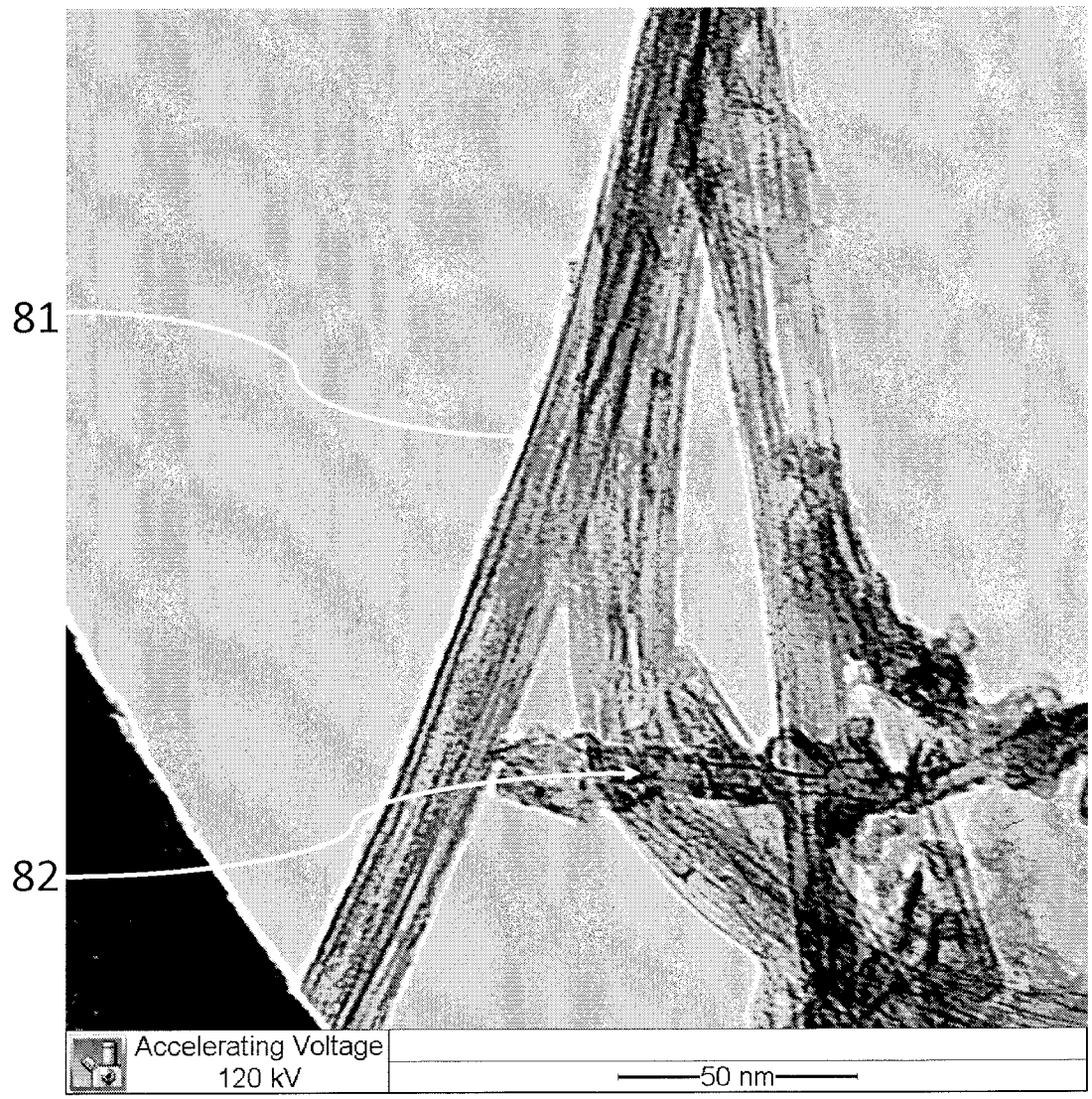
FIG. 8 is a TEM image of a portion of the product of Example 2, the image showing (inter alia) a clump of boron nitride nanotube structures and epitaxial h-BN/BNNT structures.

FIG. 8 is a TEM image of a portion of the product of Example 2, the image showing a clump of boron nitride nanotube structures and epitaxial h-BN/BNNT structures.

Reference number 81 points to an example of an independent clump of boron nitride nanotubes (i.e., a clump without epitaxial hexagonal boron nitride nucleation or growth) in the TEM image of FIG. 8.

Reference number 82 points to an example of an epitaxial h-BN/BNNT structure (comprising boron nitride nucleation on a side of a bundle of boron nitride nanotube structures) in the TEM image of FIG. 8.

Figure 9:
FIG. 9 is a TEM image of a portion of the product of Example 2, the image showing (inter alia) epitaxial h-BN/BNNT structures.

FIG. 9 is a TEM image of a portion of the product of Example 2, the image showing epitaxial h-BN/BNNT structures.

Reference number 91 points to an example of an epitaxial h-BN/BNNT structure (comprising a single boron nitride nanotube structure) in the TEM image of FIG. 9.

Reference number 92 points to an example of an epitaxial h-BN/BNNT structure (comprising a clump of boron nitride nanotube structures) in the TEM image of FIG. 9.

Figure 10:
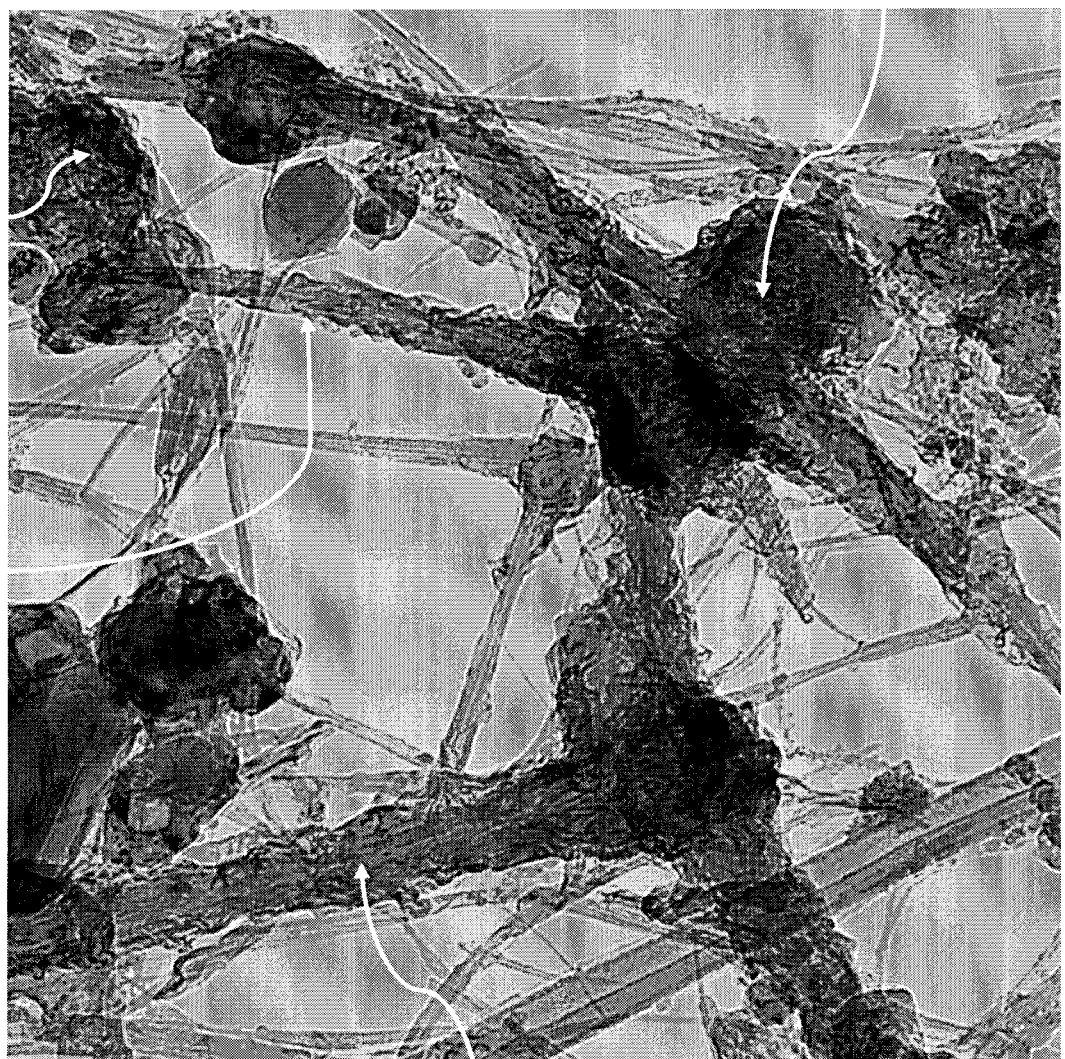
FIG. 10 is a TEM image of a portion of the product of Example 2, the image showing (inter alia) residual boron and epitaxial h-BN/BNNT structures.

FIG. 10 is a TEM image of a portion of the product of Example 2, the image showing residual boron and epitaxial h-BN/BNNT structures.

Reference numbers 101 and 102 point to examples of residual amorphous boron in the TEM image of FIG. 10.

Reference number 103 points to an example of an epitaxial h-BN/BNNT structure in the TEM image of FIG. 10.

Reference number 104 points to an example of an epitaxial h-BN/BNNT structure (comprising a clump of boron nitride nanotube structures) in the TEM image of FIG. 10.

Figure 11:
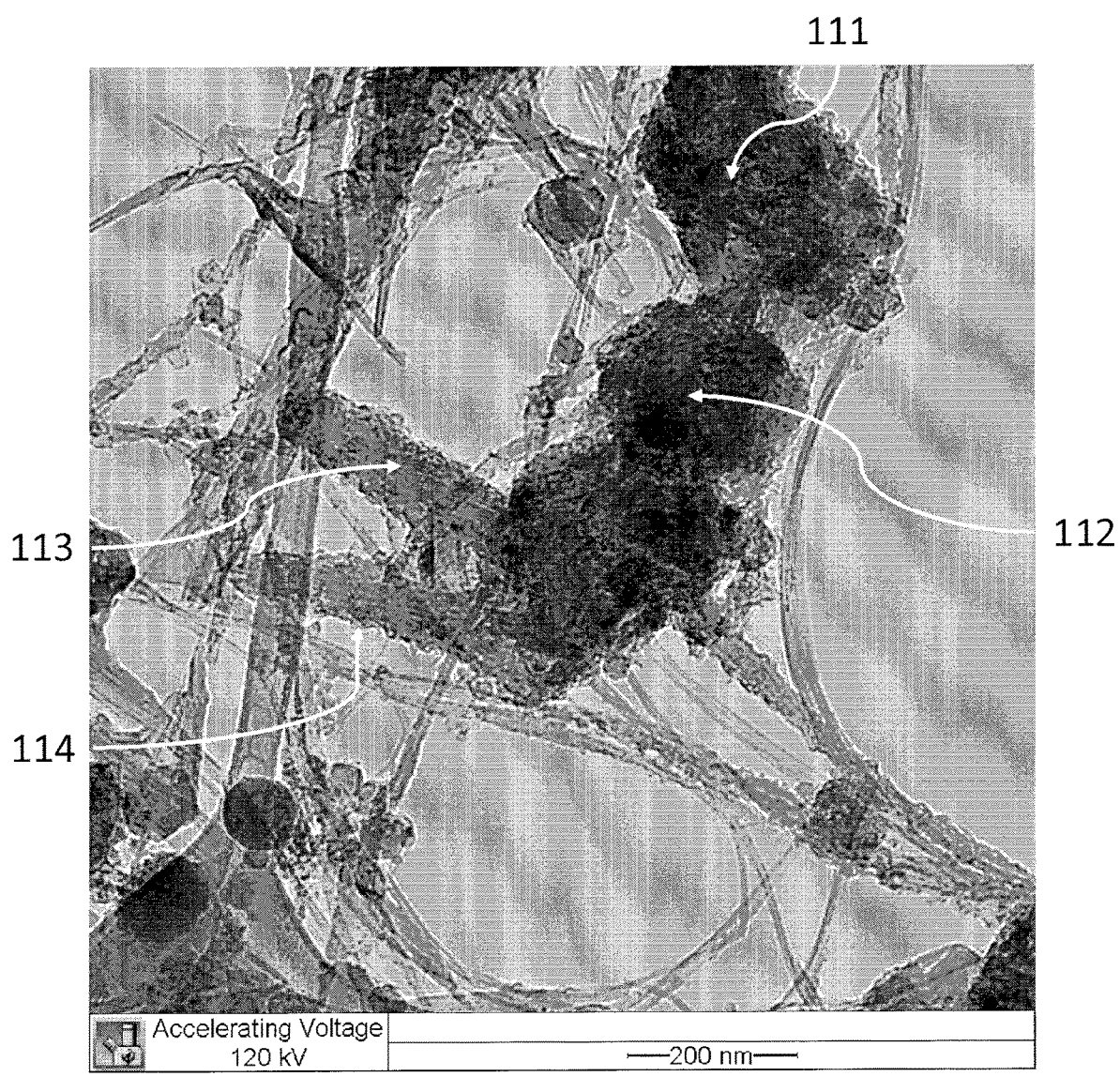
FIG. 11 is a TEM image of a portion of the product of Example 2, the image showing (inter alia) residual boron and epitaxial h-BN/BNNT structures.

FIG. 11 is a TEM image of a portion of the product of Example 2, the image showing residual boron and epitaxial h-BN/BNNT structures.

Reference numbers 111 and 112 point to examples of residual amorphous boron in the TEM image of FIG. 11.

Reference numbers 113 and 114 point to examples of epitaxial h-BN/BNNT structures in the TEM image of FIG. 11.

Figure 12:
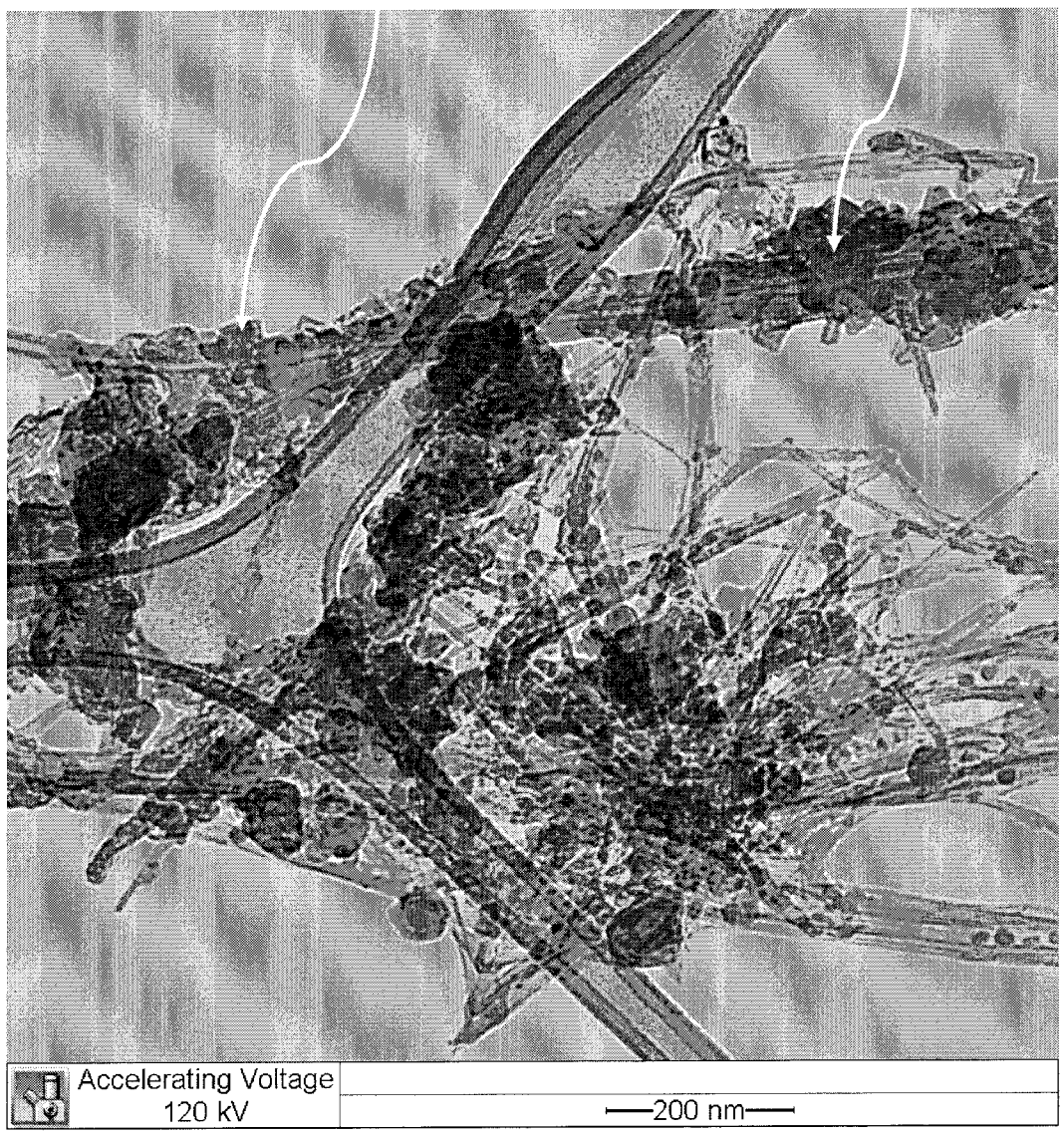
FIG. 12 is a TEM image of a portion of the product of Example 2, the image showing (inter alia) epitaxial h-BN/BNNT structures.

FIG. 12 is a TEM image of a portion of the product of Example 2, the image showing epitaxial h-BN/BNNT structures.

Reference numbers 121 and 122 point to examples of epitaxial h-BN/BNNT structures in the TEM image of FIG. 12.

More than 50% of a sum of the independent boron nitride nanotubes and the boron nitride nanotube structures were single-wall, with the remainder double-wall and multi-wall.

Less than 1% of a sum of the independent boron nitride nanotubes and the boron nitride nanotube structures had dixie cup defects or banboo defects.

A sum of the mass of residual boron and independent hexagonal boron nitride was less than 35% by mass of the product.

Figure 13:
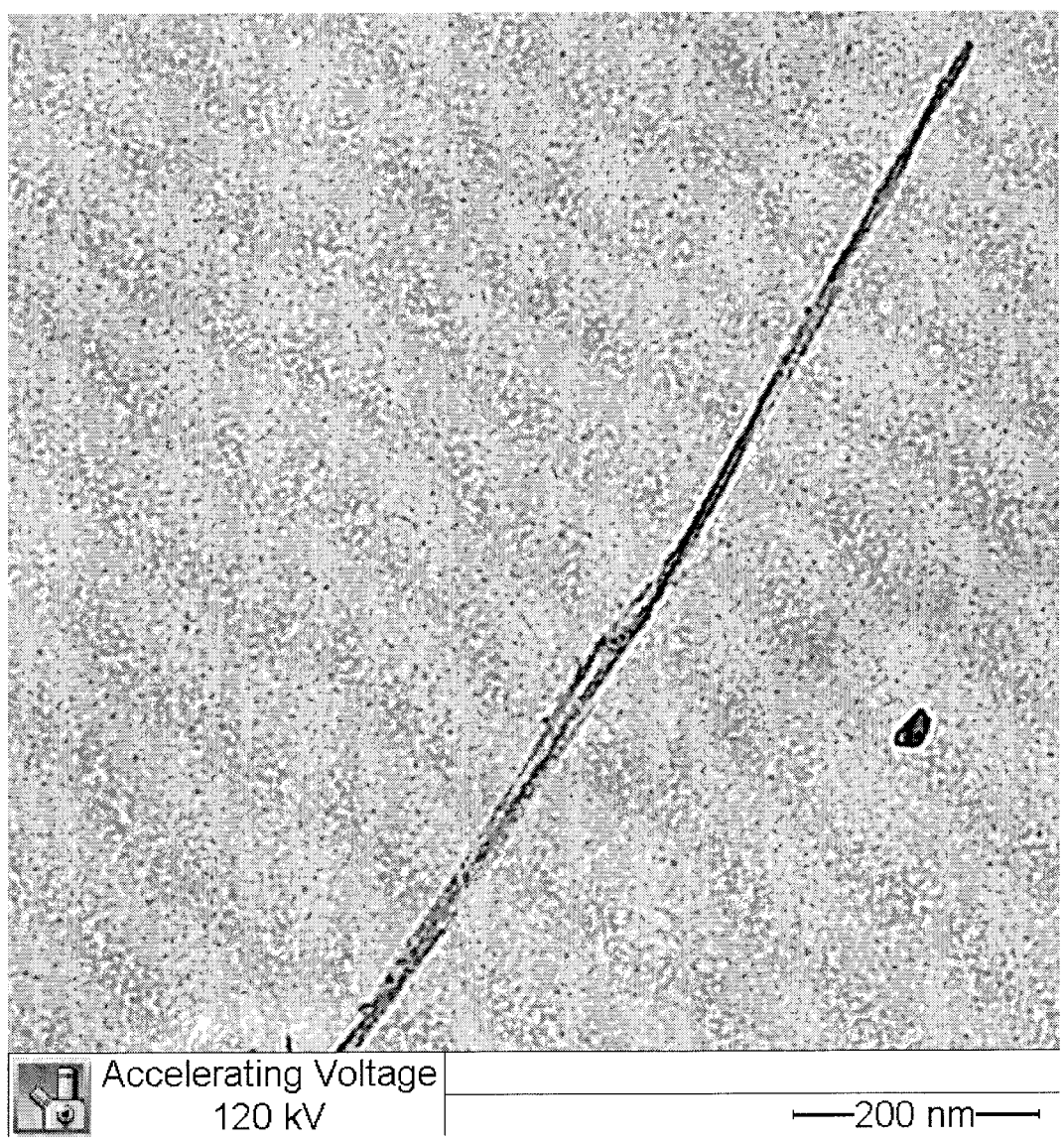
FIG. 13 is a TEM image of an independent boron nitride nanotube.

FIG. 13 is a TEM image of an independent boron nitride nanotube.

Below are a series of numbered passages, each of which defines subject matter within the scope of the present inventive subject matter:

Passage 1. A composition comprising:
at least a first epitaxial h-BN/BNNT structure, the first epitaxial h-BN/BNNT structure comprising at
   least a first boron nitride nanotube structure and at least
   a first hexagonal boron nitride structure,
the first hexagonal boron nitride structure epitaxial with
   respect to the first boron nitride nanotube structure.

Passage 2. A composition as recited in passage 1, wherein:
a sum of [1] a quantity of independent boron nitride
   nanotubes in the composition that have a length of at
   least 50 nm, and [2] a quantity of boron nitride nanotube structures in the composition that have a length of
   at least 50 nm, is at least ten,
for each of a quantity of boron nitride nanotube structures
   that is at least 10% of the sum of [1] the quantity of
   independent boron nitride nanotubes in the composition that have a length of at least 50 nm, and [2] the
   quantity of boron nitride nanotube structures in the
   composition that have a length of at least 50 nm:
   the boron nitride nanotube structure has a length of at
      least 50 nm, and a total of at least 10% of the
      outermost wall of the boron nitride nanotube structure is covered by hexagonal boron nitride structures
      that are each epitaxial with respect to the boron
      nitride nanotube structure.

Passage 3. A composition as recited in passage 2, wherein:
for each of a quantity of boron nitride nanotube structures
   that is at least 30% of the sum of [1] the quantity of
   independent boron nitride nanotubes in the composition that have a length of at least 50 nm, and [2] the
   quantity of boron nitride nanotube structures in the
   composition that have a length of at least 50 nm:
   the boron nitride nanotube structure has a length of at
      least 50 nm, and a total of at least 30% of the
      outermost wall of the boron nitride nanotube structure is covered by hexagonal boron nitride structures
      that are each epitaxial with respect to the boron
      nitride nanotube structure.

Passage 4. A composition as recited in passage 2, wherein:
for each of a quantity of boron nitride nanotube structures
   that is at least 80% of the sum of [1] the quantity of
   independent boron nitride nanotubes in the composition that have a length of at least 50 nm, and [2] the
   quantity of boron nitride nanotube structures in the
   composition that have a length of at least 50 nm:
   the boron nitride nanotube structure has a length of at
      least 50 nm, and a total of at least 30% of the
      outermost wall of the boron nitride nanotube structure is covered by hexagonal boron nitride structures
      that are each epitaxial with respect to the boron
      nitride nanotube structure.

Passage 5. A composition as recited in passage 1, wherein:
a sum of respective quantities of [1] independent boron
   nitride nanotube clumps in the composition that have a
   length of at least 50 nm, [2] boron nitride nanotube
   structure clumps in the composition that have a length
   of at least 50 nm, [3] boron nitride nanotube structure/
   independent boron nitride nanotube clumps in the composition that have a length of at least 50 nm, [4]
   independent boron nitride nanotubes in the composition that are not in a clump and that have a length of at
   least 50 nm, and [5] boron nitride nanotube structures
   in the composition that are not in a clump and that have
   a length of at least 50 nm, is at least ten,
for each of a quantity that is at least 30% of said sum,
   among [2] the boron nitride nanotube structure clumps
   in the composition that have a length of at least 50 nm,
   [3] the boron nitride nanotube structure/independent
   boron nitride nanotube clumps in the composition that
   have a length of at least 50 nm, and [5] the boron nitride
   nanotube structures in the composition that are not in a
   clump and that have a length of at least 50 nm:
   a total of at least 10% of exterior atoms of [2] the boron
      nitride nanotube structure clump, [3] the boron nitride
      nanotube structure/independent boron nitride nanotube
      clump, or [5] the boron nitride nanotube structure that
      is not in a clump,
   is covered by hexagonal boron nitride structures that are
      each epitaxial with respect to a boron nitride nanotube
      structure in [2] the boron nitride nanotube structure
      clump, [3] the boron nitride nanotube structure/independent boron nitride nanotube clump, or [5] the boron
      nitride nanotube structure that is not in a clump.

Passage 6. A composition as recited in passage 5, wherein:
for each of a quantity that is at least 30% of said sum,
   among [2] the boron nitride nanotube structure clumps
   in the composition that have a length of at least 50 nm,
   [3] the boron nitride nanotube structure/independent
   boron nitride nanotube clumps in the composition that
   have a length of at least 50 nm, and [5] the boron nitride
   nanotube structures in the composition that are not in a
   clump and that have a length of at least 50 nm:
   a total of at least 30% of exterior atoms of [2] the boron
      nitride nanotube structure clump, [3] the boron nitride
      nanotube structure/independent boron nitride nanotube
      clump, or [5] the boron nitride nanotube structure that
      is not in a clump,
   is covered by hexagonal boron nitride structures that are
      each epitaxial with respect to a boron nitride nanotube
      structure in [2] the boron nitride nanotube structure
      clump, [3] the boron nitride nanotube structure/independent boron nitride nanotube clump, or [5] the boron
      nitride nanotube structure that is not in a clump.

Passage 7. A composition as recited in passage 5, wherein:
for each of a quantity that is at least 80% of said sum,
   among [2] the boron nitride nanotube structure clumps
   in the composition that have a length of at least 50 nm,
   [3] the boron nitride nanotube structure/independent
   boron nitride nanotube clumps in the composition that
   have a length of at least 50 nm, and [5] the boron nitride
   nanotube structures in the composition that are not in a
   clump and that have a length of at least 50 nm:
   a total of at least 30% of exterior atoms of [2] the boron
      nitride nanotube structure clump, [3] the boron nitride
      nanotube structure/independent boron nitride nanotube
      clump, or [5] the boron nitride nanotube structure that
      is not in a clump,
   is covered by hexagonal boron nitride structures that are
      each epitaxial with respect to a boron nitride nanotube
      structure in [2] the boron nitride nanotube structure
      clump, [3] the boron nitride nanotube structure/independent boron nitride nanotube clump, or [5] the boron
      nitride nanotube structure that is not in a clump.

Passage 8. An aggregate comprising:
a one-piece structure comprising at least a first epitaxial
   h-BN/BNNT structure,
the first epitaxial h-BN/BNNT structure comprising at
   least a first boron nitride nanotube structure and at least
   a first hexagonal boron nitride structure,
the first hexagonal boron nitride structure epitaxial with
   respect to the boron nitride nanotube structure,
the one-piece structure having a first dimension of at least
   100 nm and a second dimension of at least 100 nm, the
   second dimension perpendicular to the first dimension.

Passage 9. An aggregate as recited in passage 8, wherein:

for each of a quantity of boron nitride nanotube structures in the one-piece structure that is at least 10% of the sum of [1] the quantity of independent boron nitride nanotubes in the one-piece structure that have a length of at least 50 nm, and [2] the quantity of boron nitride nanotube structures in the one-piece structure that have a length of at least 50 nm:
   a total of at least 10% of the outermost wall of the boron nitride nanotube structure is covered by hexagonal boron nitride structures that are each epitaxial with respect to the boron nitride nanotube structure.

Passage 10. An aggregate as recited in passage 9, wherein:
for each of a quantity of boron nitride nanotube structures in the one-piece structure that is at least 30% of the sum of [1] the quantity of independent boron nitride nanotubes in the one-piece structure that have a length of at least 50 nm, and [2] the quantity of boron nitride nanotube structures in the one-piece structure that have a length of at least 50 nm:
   a total of at least 30% of the outermost wall of the boron nitride nanotube structure is covered by hexagonal boron nitride structures that are each epitaxial with respect to the boron nitride nanotube structure.

Passage 11. An aggregate as recited in passage 9, wherein:
for each of a quantity of boron nitride nanotube structures in the one-piece structure that is at least 80% of the sum of [1] the quantity of independent boron nitride nanotubes in the one-piece structure that have a length of at least 50 nm, and [2] the quantity of boron nitride nanotube structures in the one-piece structure that have a length of at least 50 nm:
   a total of at least 30% of the outermost wall of the boron nitride nanotube structure is covered by hexagonal boron nitride structures that are each epitaxial with respect to the boron nitride nanotube structure.

Passage 12. An aggregate as recited in passage 8, wherein:
for each of a quantity among [2] boron nitride nanotube structure clumps in the one-piece structure that have a length of at least 50 nm, [3] boron nitride nanotube structure/independent boron nitride nanotube clumps in the one-piece structure that have a length of at least 50 nm, and [5] boron nitride nanotube structures in the one-piece structure that are not in a clump and that have a length of at least 50 nm, that is at least 10% of a sum of respective quantities of [1] independent boron nitride nanotube clumps in the one-piece structure that have a length of at least 50 nm, [2] boron nitride nanotube structure clumps in the one-piece structure that have a length of at least 50 nm, [3] boron nitride nanotube structure/independent boron nitride nanotube clumps in the one-piece structure that have a length of at least 50 nm, [4] independent boron nitride nanotubes in the one-piece structure that are not in a clump and that have a length of at least 50 nm, and [5] boron nitride nanotube structures in the one-piece structure that are not in a clump and that have a length of at least 50 nm:
   a total of at least 10% of exterior atoms of [2] the boron nitride nanotube structure clump, [3] the boron nitride nanotube structure/independent boron nitride nanotube clump, or [5] the boron nitride nanotube structure that is not in a clump,
     is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump.

Passage 13. An aggregate as recited in passage 12, wherein:
for each of a quantity among [2] boron nitride nanotube structure clumps in the one-piece structure that have a length of at least 50 nm, [3] boron nitride nanotube structure/independent boron nitride nanotube clumps in the one-piece structure that have a length of at least 50 nm, and [5] boron nitride nanotube structures in the one-piece structure that are not in a clump and that have a length of at least 50 nm, that is at least 30% of a sum of respective quantities of [1] independent boron nitride nanotube clumps in the one-piece structure that have a length of at least 50 nm, [2] boron nitride nanotube structure clumps in the one-piece structure that have a length of at least 50 nm, [3] boron nitride nanotube structure/independent boron nitride nanotube clumps in the one-piece structure that have a length of at least 50 nm, [4] independent boron nitride nanotubes in the one-piece structure that are not in a clump and that have a length of at least 50 nm, and [5] boron nitride nanotube structures in the one-piece structure that are not in a clump and that have a length of at least 50 nm:
   a total of at least 30% of exterior atoms of [2] the boron nitride nanotube structure clump, [3] the boron nitride nanotube structure/independent boron nitride nanotube clump, or [5] the boron nitride nanotube structure that is not in a clump,
     is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump.

Passage 14. An aggregate as recited in passage 12, wherein:
for each of a quantity among [2] boron nitride nanotube structure clumps in the one-piece structure that have a length of at least 50 nm, [3] boron nitride nanotube structure/independent boron nitride nanotube clumps in the one-piece structure that have a length of at least 50 nm, and [5] boron nitride nanotube structures in the one-piece structure that are not in a clump and that have a length of at least 50 nm, that is at least 80% of a sum of respective quantities of [1] independent boron nitride nanotube clumps in the one-piece structure that have a length of at least 50 nm, [2] boron nitride nanotube structure clumps in the one-piece structure that have a length of at least 50 nm, [3] boron nitride nanotube structure/independent boron nitride nanotube clumps in the one-piece structure that have a length of at least 50 nm, [4] independent boron nitride nanotubes in the one-piece structure that are not in a clump and that have a length of at least 50 nm, and [5] boron nitride nanotube structures in the one-piece structure that are not in a clump and that have a length of at least 50 nm:
   a total of at least 30% of exterior atoms of [2] the boron nitride nanotube structure clump, [3] the boron nitride nanotube structure/independent boron nitride nanotube clump, or [5] the boron nitride nanotube structure that is not in a clump,
     is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump.

Passage 15. A composition, comprising:
a plurality of independent boron nitride nanotubes,
a sum of [1] a total mass of any independent hexagonal boron nitride in the composition and [2] a total mass of any residual boron in the composition accounts for not more than 35% of the mass of the composition.

Passage 16. A composition as recited in passage 15, wherein a sum of [1] the total mass of any independent hexagonal boron nitride in the composition and [2] the total mass of any residual boron in the composition accounts for not more than 25% of the mass of the composition.

Passage 17. An aggregate, comprising:
a one-piece structure comprising a plurality of independent boron nitride nanotubes,
the one-piece structure having a first dimension of at least 100 nm and a second dimension of at least 100 nm, the second dimension perpendicular to the first dimension,
a sum of [1] a total mass of independent hexagonal boron nitride in the one-piece structure and [2] a total mass of any residual boron in the one-piece structure accounts for not more than 35% of the mass of the one-piece structure.

Passage 18. An aggregate as recited in passage 17, wherein a sum of [1] the total mass of any independent hexagonal boron nitride in the aggregate and [2] the total mass of any residual boron in the aggregate accounts for not more than 25% of the mass of the aggregate.

Passage 19. A composition, comprising:
at least ten independent boron nitride nanotubes that have a length of at least 50 nm,
among a sum of [1] the independent boron nitride nanotubes in the composition that have a length of at least 50 nm, and [2] boron nitride nanotube structures in the composition that have a length of at least 50 nm, not more than 1% of said sum have at least one defect selected from among dixie cup defects and bamboo defects.

Passage 20. An aggregate, comprising:
a one-piece structure comprising a plurality of independent boron nitride nanotubes,
the one-piece structure having a first dimension of at least 100 nm and a second dimension of at least 100 nm, the second dimension perpendicular to the first dimension,
among a sum of [1] the independent boron nitride nanotubes in the one-piece structure that have a length of at least 50 nm, and [2] boron nitride nanotube structures in the one-piece structure that have a length of at least 50 nm, not more than 1% of said sum have at least one defect selected from among dixie cup defects and bamboo defects.

Passage 21. A composition, comprising:
at least ten independent boron nitride nanotubes,
among a sum of [1] the independent boron nitride nanotubes in the composition that have a length of at least 50 nm, and [2] boron nitride nanotube structures in the composition that have a length of at least 50 nm, each of at least 50% of said sum is single-wall.

Passage 22. A composition as recited in passage 21, wherein each of at least some of said sum of [1] the independent boron nitride nanotubes in the composition that have a length of at least 50 nm, and [2] the boron nitride nanotube structures in the composition that have a length of at least 50 nm, that is single-wall is in an independent boron nitride nanotube clump, a boron nitride nanotube structure clump, or a boron nitride nanotube structure/independent boron nitride nanotube clump.

Passage 23. A composition as recited in passage 21, wherein among a sum of [1] the independent boron nitride nanotubes in the composition that have a length of at least 50 nm, and [2] boron nitride nanotube structures in the composition that have a length of at least 50 nm, each of 50-60 percent of said sum is single-wall.

Passage 24. An aggregate, comprising:
a one-piece structure comprising at least one independent boron nitride nanotube,
the one-piece structure having a first dimension of at least 100 nm and a second dimension of at least 100 nm, the second dimension perpendicular to the first dimension,
among a sum of [1] the independent boron nitride nanotubes in the one-piece structure that have a length of at least 50 nm, and [2] boron nitride nanotube structures in the one-piece structure that have a length of at least 50 nm, each of at least 50% of said sum is single-wall.

Passage 25. An aggregate as recited in passage 24, wherein each of at least some of said sum of [1] the independent boron nitride nanotubes in the one-piece structure that have a length of at least 50 nm, and [2] the boron nitride nanotube structures in the one-piece structure that have a length of at least 50 nm, that is single-wall is in an independent boron nitride nanotube clump, a boron nitride nanotube structure clump, or a boron nitride nanotube structure/independent boron nitride nanotube clump.

Passage 26. An aggregate as recited in passage 24, wherein among a sum of [1] the independent boron nitride nanotubes in the one-piece structure that have a length of at least 50 nm, and [2] boron nitride nanotube structures in the one-piece structure that have a length of at least 50 nm, each of 50-60 percent of said sum is single-wall.

Passage 27. A composition as recited in any one of passages 1-7, 19 and 21, wherein a combined mass of the epitaxial h-BN/BNNT structures in the composition accounts for at least 65% of the mass of the composition.

Passage 28. A composition as recited in passage 27, wherein the combined mass of the epitaxial h-BN/BNNT structures in the composition accounts for at least 75% of the mass of the composition.

Passage 29. An aggregate as recited in any one of passages 8-14, 20 and 24, wherein a combined mass of the epitaxial h-BN/BNNT structures in the composition accounts for at least 65% of the mass of the one-piece structure.

Passage 30. An aggregate as recited in passage 29, wherein the combined mass of the epitaxial h-BN/BNNT structures in the composition accounts for at least 75% of the mass of the one-piece structure.

Passage 31. A composition as recited in any one of passages 1-7, 15, 16, 19, 21-23, 27 and 28, wherein at least 10% by mass of the composition comprises hexagonal boron nitride structures that are each epitaxial with respect to a boron nitride nanotube structure.

Passage 32. An aggregate as recited in any one of passages 8-14, 17, 18, 20, 24-26, 29 and 30, wherein at least 10% by mass of the one-piece structure comprises hexagonal boron nitride structures that are each epitaxial with respect to a boron nitride nanotube structure.

Passage 33. A composition as recited in any one of passages 1-7, 15, 16, 19, 21-23, 27, 28 and 31, wherein for each of at least 10% of the atoms in the composition, the atom is in a hexagonal boron nitride structure that is epitaxial with a boron nitride nanotube structure in the composition.

Passage 34. An aggregate as recited in any one of passages 8-14, 17, 18, 20, 24-26, 29, 30 and 32, wherein for each of at least 10% of the atoms in the one-piece structure, the atom is in a hexagonal boron nitride structure that is epitaxial with a boron nitride nanotube structure in the composition.

Passage 35. A composition as recited in any one of passages 1-7, 27, 28, 31 and 33, wherein the sum of [1] a combined mass of any independent hexagonal boron nitride in the composition and [2] a combined mass of any amorphous boron in the composition accounts for less than 35% of the mass of the composition.

Passage 36. An aggregate as recited in any one of passages 8-14, 29, 30, 32 and 34, wherein the sum of [1] a combined mass of any independent hexagonal boron nitride in the one-piece structure and [2] a combined mass of any amorphous boron in the one-piece structure accounts for less than 35% of the mass of the one-piece structure.

Passage 37. A composition as recited in any one of passages 1-7, 15, 16, 27, 28, 31, 33 and 35, wherein among a sum of [1] the independent boron nitride nanotubes in the composition that have a length of at least 50 nm, and [2] boron nitride nanotube structures in the composition that have a length of at least 50 nm, not more than 1% of said sum have at least one defect selected from among dixie cup defects and bamboo defects.

Passage 38. An aggregate as recited in any one of passages 8-14, 17, 18, 29, 30, 32, 34 and 36, wherein among a sum of [1] the independent boron nitride nanotubes in the one-piece structure that have a length of at least 50 nm, and [2] boron nitride nanotube structures in the one-piece structure that have a length of at least 50 nm, not more than 1% of said sum have at least one defect selected from among dixie cup defects and bamboo defects.

Passage 39. A composition as recited in any one of passages 1-7, 15, 16, 19, 27, 28, 31, 33, 35 and 37, wherein among a sum of [1] the independent boron nitride nanotubes in the composition that have a length of at least 50 nm, and [2] boron nitride nanotube structures in the composition that have a length of at least 50 nm, each of at least 50% of said sum is single-wall.

Passage 40. An aggregate as recited in any one of passages 8-14, 17, 18, 20, 29, 30, 32, 34, 36 and 38, wherein among a sum of [1] the independent boron nitride nanotubes in the one-piece structure that have a length of at least 50 nm, and [2] boron nitride nanotube structures in the one-piece structure that have a length of at least 50 nm, each of at least 50% of said sum is single-wall.

Passage 41. A composition as recited in any one of passages 15, 16, 27, 28, 31, 33, 35, 37 and 39, wherein independent hexagonal boron nitride accounts for not more than 1 percent by mass of the composition.

Passage 42. An aggregate as recited in any one of passages 17, 18, 29, 30, 32, 34, 36, 38 and 40, wherein independent hexagonal boron nitride accounts for not more than 1 percent by mass of the aggregate.

Passage 43. A method of making a composition, comprising:
  supplying to a first region of a chamber a mixture of nitrogen gas and hydrogen gas;
  converting at least a portion of the mixture of nitrogen gas and hydrogen gas to plasma;
  supplying to a second region of the chamber a mixture of at least one boron-containing material and nitrogen gas, whereby the mixture of at least one boron-containing material and nitrogen gas contacts the plasma to form a reaction mixture;
  converting at least a portion of the mixture to epitaxial h-BN/BNNT structures.

Passage 44. A method as recited in passage 43, wherein the chamber comprises:
  the first region;
  the second region;
  at least a third region;
  a first connection section providing communication between the first region and the second region; and
  a second connection section providing communication between the second region and the third region,
  the first region having at least one first region cross-sectional area perpendicular to an axis of the chamber, the axis of the chamber extending through the first region, the second region and the third region,
  the second region having at least one second region cross-sectional area perpendicular to the axis of the chamber,
  the third region having at least one third region cross-sectional area perpendicular to the axis of the chamber,
  the first connection section having at least one first connection section cross-sectional area perpendicular to the axis of the chamber,
  the second connection section having at least one second connection section cross-sectional area perpendicular to the axis of the chamber,
  each first connection section cross-sectional area smaller than the first region cross-sectional area and smaller than the second region cross-sectional area,
  each second connection section cross-sectional area smaller than the third region cross-sectional area.

Passage 45. A method as recited in passage 44, wherein pressure within at least a portion of the third region is at least 10 psi.

Passage 46. A method as recited in passage 44, wherein pressure within at least a portion of the third region is in the range of 10-20 psi.

Passage 47. A method as recited in passage 44, wherein pressure within at least a portion of the third region is in the range of 15-20 psi.

Passage 48. A method as recited in any one of passages 43-47, wherein the weight percentage of hydrogen gas in the mixture of nitrogen gas and hydrogen gas is at least 2 percent by mass.

Passage 49. A method as recited in any one of passages 43-47, wherein the weight percentage of hydrogen gas in the mixture of nitrogen gas and hydrogen gas is at least 3 percent by mass.

Passage 50. A method as recited in any one of passages 43-47, wherein the weight percentage of hydrogen gas in the mixture of nitrogen gas and hydrogen gas is at least 4 percent by mass.

Passage 51. A method as recited in any one of passages 43-50, wherein the mixture of nitrogen gas and hydrogen gas is supplied to the first region in an amount of at least 30 liters per minute.

Passage 52. A method as recited in any one of passages 43-50, wherein the mixture of nitrogen gas and hydrogen gas is supplied to the first region in an amount of at least 40 liters per minute.

Passage 53. A method as recited in any one of passages 43-50, wherein the mixture of nitrogen gas and hydrogen gas is supplied to the first region in an amount of at least 50 liters per minute.

Passage 54. A method as recited in any one of passages 43-53, wherein said supplying to a second region of the chamber of a mixture of at least one boron-containing material and nitrogen gas comprises supplying boron at a rate of at least 20 mg/minute.

Passage 55. A method as recited in any one of passages 43-53, wherein said supplying to a second region of the chamber of a mixture of at least one boron-containing material and nitrogen gas comprises supplying boron at a rate in the range of from 20 mg/minute to 90 mg/minute.

Passage 56. A method as recited in any one of passages 43-55, wherein said supplying to a second region of the chamber of a mixture of at least one boron-containing material and nitrogen gas comprises supplying nitrogen gas at a rate in the range of from 0.1 liters per minute to 1.3 liters per minute.

Passage 57. A method as recited in any one of passages 43-55, wherein said supplying to a second region of the chamber of a mixture of at least one boron-containing material and nitrogen gas comprises supplying nitrogen gas at a rate in the range of from 1.3 liters per minute to 8.4 liters per minute.

Passage 58. A method as recited in any one of passages 43-57, wherein said converting at least a portion of the mixture of nitrogen gas and hydrogen gas to plasma comprises generating electromagnetic waves within the first region.

Passage 59. A method as recited in passage 58, wherein said generating electromagnetic waves comprises supplying radio frequency energy to an electromagnetic wave generator at a power rate of at least 35 kW.

Passage 60. A method as recited in passage 58, wherein said generating electromagnetic waves comprises supplying radio frequency energy to an electromagnetic wave generator at a power rate of at least 39 kW.

Passage 61. A method as recited in any one of passages 43-60, wherein the method further comprises contacting at least some of the epitaxial h-BN/BNNT structures with nitric acid.

Passage 62. A method as recited in any one of passages 43-61, wherein the method further comprises subjecting at least some of the epitaxial h-BN/BNNT structures to a temperature in the range of from 700 to 900 degrees C.

The invention claimed is:

1. A composition comprising:
at least a first h-BN/BNNT structure,
the first h-BN/BNNT structure comprising at least a first boron nitride nanotube structure and at least a first hexagonal boron nitride structure, wherein:
a sum of [1] a quantity of independent boron nitride nanotubes in the composition that have a length of at least 50 nm, and [2] a quantity of boron nitride nanotube structures in the composition that have a length of at least 50 nm, is at least ten,
for each of a quantity of boron nitride nanotube structures that is at least 10% of the sum of [1] the quantity of independent boron nitride nanotubes in the composition that have a length of at least 50 nm, and [2] the quantity of boron nitride nanotube structures in the composition that have a length of at least 50 nm:
the boron nitride nanotube structure has a length of at least 50 nm, and a total of at least 10% of the outermost wall of the boron nitride nanotube structure is covered by hexagonal boron nitride structures.

2. A composition as recited in claim 1, wherein:
for each of a quantity of boron nitride nanotube structures that is at least 30% of the sum of [1] the quantity of independent boron nitride nanotubes in the composition that have a length of at least 50 nm, and [2] the quantity of boron nitride nanotube structures in the composition that have a length of at least 50 nm:
the boron nitride nanotube structure has a length of at least 50 nm, and a total of at least 30% of the outermost wall of the boron nitride nanotube structure is covered by hexagonal boron nitride structures.

3. A composition as recited in claim 1, wherein:
for each of a quantity of boron nitride nanotube structures that is at least 80% of the sum of [1] the quantity of independent boron nitride nanotubes in the composition that have a length of at least 50 nm, and [2] the quantity of boron nitride nanotube structures in the composition that have a length of at least 50 nm:
the boron nitride nanotube structure has a length of at least 50 nm, and a total of at least 30% of the outermost wall of the boron nitride nanotube structure is covered by hexagonal boron nitride structures.

4. A composition as recited in claim 1, wherein:
a sum of respective quantities of [1] independent boron nitride nanotube clumps in the composition that have a length of at least 50 nm, [2] boron nitride nanotube structure clumps in the composition that have a length of at least 50 nm, [3] boron nitride nanotube structure/independent boron nitride nanotube clumps in the composition that have a length of at least 50 nm, [4] independent boron nitride nanotubes in the composition that are not in a clump and that have a length of at least 50 nm, and [5] boron nitride nanotube structures in the composition that are not in a clump and that have a length of at least 50 nm, is at least ten,
for each of a quantity that is at least 30% of said sum, among [2] the boron nitride nanotube structure clumps in the composition that have a length of at least 50 nm, [3] the boron nitride nanotube structure/independent boron nitride nanotube clumps in the composition that have a length of at least 50 nm, and [5] the boron nitride nanotube structures in the composition that are not in a clump and that have a length of at least 50 nm:
a total of at least 10% of exterior atoms of [2] the boron nitride nanotube structure clump, [3] the boron nitride nanotube structure/independent boron nitride nanotube clump, or [5] the boron nitride nanotube structure that is not in a clump,
is covered by hexagonal boron nitride structures.

5. An aggregate comprising:
a one-piece structure comprising a composition comprising at least a first h-BN/BNNT structure as recited in claim 1,
the one-piece structure having a first dimension of at least 100 nm and a second dimension of at least 100 nm, the second dimension perpendicular to the first dimension.

6. An aggregate as recited in claim 5, wherein:
for each of a quantity among [2] boron nitride nanotube structure clumps in the one-piece structure that have a length of at least 50 nm, [3] boron nitride nanotube structure/independent boron nitride nanotube clumps in the one-piece structure that have a length of at least 50 nm, and [5] boron nitride nanotube structures in the one-piece structure that are not in a clump and that have a length of at least 50 nm,
that is at least 10% of a sum of respective quantities of [1] independent boron nitride nanotube clumps in the one-piece structure that have a length of at least 50 nm, [2] boron nitride nanotube structure clumps in the one-piece structure that have a length of at least 50 nm, [3] boron nitride nanotube structure/independent boron nitride nanotube clumps in the one-piece structure that have a length of at least 50 nm, [4] independent boron nitride nanotubes in the one-piece structure that are not in a clump and that have a length of at least 50 nm, and [5] boron nitride nanotube structures in the one-piece structure that are not in a clump and that have a length of at least 50 nm:
    a total of at least 10% of exterior atoms of [2] the boron nitride nanotube structure clump, [3] the boron nitride nanotube structure/independent boron nitride nanotube clump, or [5] the boron nitride nanotube structure that is not in a clump,
        is covered by hexagonal boron nitride structures in [2] the boron nitride nanotube structure clump, [3] the boron nitride nanotube structure/independent boron nitride nanotube clump, or [5] the boron nitride nanotube structure that is not in a clump.

7. A composition comprising:
at least a first epitaxial h-BN/BNNT structure; and
at least one metal,
the first epitaxial h-BN/BNNT structure comprising at least a first boron nitride nanotube structure and at least a first hexagonal boron nitride structure,
the first hexagonal boron nitride structure epitaxial with respect to the first boron nitride nanotube structure, wherein atoms in the first hexagonal boron nitride structure are epitaxially aligned with the atoms in the first boron nitride nanotube structure that are closest to the first hexagonal boron nitride structure,
the at least one metal adhered to the first epitaxial h-BN/BNNT structure.

8. A composition as recited in claim 7, wherein the at least one metal comprises at least one atom selected from aluminum, magnesium and titanium.

9. A composition as recited in claim 7, wherein:
a sum of [1] a quantity of independent boron nitride nanotubes in the composition that have a length of at least 50 nm, and [2] a quantity of boron nitride nanotube structures in the composition that have a length of at least 50 nm, is at least ten,
for each of a quantity of boron nitride nanotube structures that is at least 10% of the sum of [1] the quantity of independent boron nitride nanotubes in the composition that have a length of at least 50 nm, and [2] the quantity of boron nitride nanotube structures in the composition that have a length of at least 50 nm:
    the boron nitride nanotube structure has a length of at least 50 nm, and a total of at least 10% of the outermost wall of the boron nitride nanotube structure is covered by hexagonal boron nitride structures that are each epitaxial with respect to the boron nitride nanotube structure.

10. A composition as recited in claim 7, wherein:
a sum of [1] a quantity of independent boron nitride nanotubes in the composition that have a length of at least 50 nm, and [2] a quantity of boron nitride nanotube structures in the composition that have a length of at least 50 nm, is at least ten,
for each of a quantity of boron nitride nanotube structures that is at least 30% of the sum of [1] the quantity of independent boron nitride nanotubes in the composition that have a length of at least 50 nm, and [2] the quantity of boron nitride nanotube structures in the composition that have a length of at least 50 nm:
    the boron nitride nanotube structure has a length of at least 50 nm, and a total of at least 30% of the outermost wall of the boron nitride nanotube structure is covered by hexagonal boron nitride structures that are each epitaxial with respect to the boron nitride nanotube structure.

11. A composition as recited in claim 7, wherein:
a sum of respective quantities of [1] independent boron nitride nanotube clumps in the composition that have a length of at least 50 nm, [2] boron nitride nanotube structure clumps in the composition that have a length of at least 50 nm, [3] boron nitride nanotube structure/independent boron nitride nanotube clumps in the composition that have a length of at least 50 nm, [4] independent boron nitride nanotubes in the composition that are not in a clump and that have a length of at least 50 nm, and [5] boron nitride nanotube structures in the composition that are not in a clump and that have a length of at least 50 nm, is at least ten,
for each of a quantity that is at least 30% of said sum, among [2] the boron nitride nanotube structure clumps in the composition that have a length of at least 50 nm, [3] the boron nitride nanotube structure/independent boron nitride nanotube clumps in the composition that have a length of at least 50 nm, and [5] the boron nitride nanotube structures in the composition that are not in a clump and that have a length of at least 50 nm:
a total of at least 10% of exterior atoms of [2] the boron nitride nanotube structure clump, [3] the boron nitride nanotube structure/independent boron nitride nanotube clump, or [5] the boron nitride nanotube structure that is not in a clump,
is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump.

12. An aggregate comprising:
a composition comprising at least a first one-piece structure comprising a composition comprising least a first epitaxial h-BN/BNNT structure as recited in claim 7,
the one-piece structure having a first dimension of at least 100 nm and a second dimension of at least 100 nm, the second dimension perpendicular to the first dimension.

13. An aggregate as recited in claim 12, wherein:
for each of a quantity among [2] boron nitride nanotube structure clumps in the one-piece structure that have a length of at least 50 nm, [3] boron nitride nanotube structure/independent boron nitride nanotube clumps in the one-piece structure that have a length of at least 50 run, and [5] boron nitride nanotube structures in the one-piece structure that are not in a clump and that have a length of at least 50 nm,
that is at least 10% of a sum of respective quantities of [1] independent boron nitride nanotube clumps in the one-piece structure that have a length of at least 50 nm, [2]boron nitride nanotube structure clumps in the one-piece structure that have a length of at least 50 nm, [3] boron nitride nanotube structure/independent boron nitride nanotube clumps in the one-piece structure that have a length of at least 50 nm, [4] independent boron nitride nanotubes in the one-piece structure that are not in a clump and that have a length of at least 50 nm, and [5] boron nitride nanotube structures in the one-piece structure that are not in a clump and that have a length of at least 50 nm:
a total of at least 10% of exterior atoms of [2] the boron nitride nanotube structure clump, [3] the boron nitride nanotube structure/independent boron nitride nanotube clump, or [5] the boron nitride nanotube structure that is not in a clump,
is covered by hexagonal boron nitride structures in [2] the boron nitride nanotube structure clump, [3] the boron nitride nanotube structure/independent boron nitride nanotube clump, or [5] the boron nitride nanotube structure that is not in a clump.

14. A composition, comprising:
a plurality of independent boron nitride nanotubes,
a sum of [1] a total mass of any independent hexagonal boron nitride in the composition and [2] a total mass of any residual boron in the composition accounts for not more than 35% of the mass of the composition.

15. A composition as recited in claim 14, wherein independent hexagonal boron nitride accounts for not more than 1 percent by mass of the composition.

16. A composition as recited in claim 14, wherein a sum of [1] the total mass of any independent hexagonal boron nitride in the composition and [2] the total mass of any residual boron in the composition, accounts for not more than 25% of the mass of the composition.

17. A material comprising at least a first hexagonal boron nitride structure and at least a first boron nitride nanotube structure, wherein atoms in the first hexagonal boron nitride structure are epitaxially aligned with atoms in the first boron nitride nanotube structure that are closest to the first hexagonal boron nitride structure.

18. A composition as recited in claim 17, wherein:
a sum of [1] a quantity of independent boron nitride nanotubes in the composition that have a length of at least 50 nm, and [2] a quantity of boron nitride nanotube structures in the composition that have a length of at least 50 nm, is at least ten,
for each of a quantity of boron nitride nanotube structures that is at least 10% of the sum of [1] the quantity of independent boron nitride nanotubes in the composition that have a length of at least 50 nm, and [2] the quantity of boron nitride nanotube structures in the composition that have a length of at least 50 nm:
the boron nitride nanotube structure has a length of at least 50 nm, and a total of at least 10% of the outermost wall of the boron nitride nanotube structure is covered by hexagonal boron nitride structures that are each epitaxial with respect to the boron nitride nanotube structure.

19. A composition as recited in claim 17, wherein:
a sum of [1] a quantity of independent boron nitride nanotubes in the composition that have a length of at least 50 nm, and [2] a quantity of boron nitride nanotube structures in the composition that have a length of at least 50 nm, is at least ten,
for each of a quantity of boron nitride nanotube structures that is at least 30% of the sum of [1] the quantity of independent boron nitride nanotubes in the composition that have a length of at least 50 nm, and [2] the quantity of boron nitride nanotube structures in the composition that have a length of at least 50 nm:
the boron nitride nanotube structure has a length of at least 50 nm, and a total of at least 30% of the outermost wall of the boron nitride nanotube structure is covered by hexagonal boron nitride structures that are each epitaxial with respect to the boron nitride nanotube structure.

20. A composition as recited in claim 17, wherein:
a sum of respective quantities of [1] independent boron nitride nanotube clumps in the composition that have a length of at least 50 nm, [2] boron nitride nanotube structure clumps in the composition that have a length of at least 50 nm, [3] boron nitride nanotube structure/independent boron nitride nanotube clumps in the composition that have a length of at least 50 nm, [4] independent boron nitride nanotubes in the composition that are not in a clump and that have a length of at least 50 nm, and [5] boron nitride nanotube structures in the composition that are not in a clump and that have a length of at least 50 nm, is at least ten,
for each of a quantity that is at least 30% of said sum, among [2] the boron nitride nanotube structure clumps in the composition that have a length of at least 50 nm, [3] the boron nitride nanotube structure/independent boron nitride nanotube clumps in the composition that have a length of at least 50 nm, and [5] the boron nitride nanotube structures in the composition that are not in a clump and that have a length of at least 50 nm:
a total of at least 10% of exterior atoms of [2] the boron nitride nanotube structure clump, [3] the boron nitride nanotube structure/independent boron nitride nanotube clump, or [5] the boron nitride nanotube structure that is not in a clump,
is covered by hexagonal boron nitride structures that are each epitaxial with respect to a boron nitride nanotube structure in [2] the boron nitride nanotube structure clump, [3] the boron nitride nanotube structure/independent boron nitride nanotube clump, or [5] the boron nitride nanotube structure that is not in a clump.

* * * * *

UNITED STATES PATENT AND TRADEMARK OFFICE
CERTIFICATE OF CORRECTION

| | |
|---|---|
| PATENT NO. | : 11,851,326 B2 |
| APPLICATION NO. | : 17/660687 |
| DATED | : December 26, 2023 |
| INVENTOR(S) | : Jason Edward Taylor, Mark Edmond and Steven Michael Wilcenski |

It is certified that error appears in the above-identified patent and that said Letters Patent is hereby corrected as shown below:

In the Claims

Column 44, Line 49, Claim 13, change "run" to "nm"

Signed and Sealed this
Third Day of September, 2024

Katherine Kelly Vidal
*Director of the United States Patent and Trademark Office*